US010658028B2

(12) United States Patent
    Ishii et al.

(10) Patent No.: US 10,658,028 B2
(45) Date of Patent: May 19, 2020

(54) SEMICONDUCTOR STORAGE DEVICE INCLUDING MEMORY CELLS, WORD DRIVER, DUMMY WORD DRIVER

(71) Applicant: Renesas Electronics Corporation, Tokyo (JP)

(72) Inventors: Yuichiro Ishii, Tokyo (JP); Shinji Tanaka, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/062,571

(22) PCT Filed: Nov. 14, 2016

(86) PCT No.: PCT/JP2016/083675
§ 371 (c)(1),
(2) Date: Jun. 14, 2018

(87) PCT Pub. No.: WO2017/145453
PCT Pub. Date: Aug. 31, 2017

(65) Prior Publication Data
US 2018/0366184 A1    Dec. 20, 2018

(30) Foreign Application Priority Data

Feb. 25, 2016    (JP) ................. 2016/055563

(51) Int. Cl.
*G11C 11/00*        (2006.01)
*G11C 11/419*       (2006.01)
(Continued)

(52) U.S. Cl.
CPC ........... *G11C 11/419* (2013.01); *G11C 5/063* (2013.01); *G11C 5/145* (2013.01); *G11C 7/12* (2013.01);
(Continued)

(58) Field of Classification Search
CPC ........... G11C 11/419; G11C 7/12; G11C 8/08; G11C 11/413
See application file for complete search history.

(56) References Cited

U.S. PATENT DOCUMENTS 5,404,329 A     4/1995  Yamagata et al.
5,764,565 A *   6/1998  Sato .................. G11C 11/41
                                                365/154
(Continued)

FOREIGN PATENT DOCUMENTS

EP    2 884 494 A1    6/2015
JP    H 06-187788 A   7/1994
JP    2004-241058 A   8/2004

OTHER PUBLICATIONS

International Search Report (ISR) (PCT Form PCT/ISA/210), in PCT/JP2016/083675, dated Jan. 24, 2017.
(Continued)

*Primary Examiner* — Tha-o H Bui
(74) *Attorney, Agent, or Firm* — McGinn IP Law Group, PLLC

(57) ABSTRACT

A semiconductor storage device includes a plurality of memory cells arranged in a matrix, a word line provided corresponding to a memory cell row, a dummy word line formed in a metal interconnection layer adjacent to a metal interconnection layer in which the word line is formed, a word driver circuit configured to drive the word line, and a dummy word driver circuit configured to increase voltage on the word line based on interline capacitance between the word line and the dummy word line.

15 Claims, 21 Drawing Sheets

(51) Int. Cl.
  *G11C 5/06* (2006.01)
  *G11C 8/14* (2006.01)
  *G11C 11/418* (2006.01)
  *H01L 27/11* (2006.01)
  *G11C 5/14* (2006.01)
  *G11C 7/12* (2006.01)
  *G11C 8/08* (2006.01)
  *G11C 7/02* (2006.01)

(52) U.S. Cl.
  CPC ............... *G11C 8/08* (2013.01); *G11C 8/14* (2013.01); *G11C 11/418* (2013.01); *H01L 27/1104* (2013.01); *H01L 27/1116* (2013.01); *G11C 7/02* (2013.01)

(56) References Cited

U.S. PATENT DOCUMENTS

| | | | |
|---|---|---|---|
| 9,552,854 B1* | 1/2017 | Bonakdar | G11C 7/14 |
| 2004/0156230 A1* | 8/2004 | Satomi | G11C 11/413 |
| | | | 365/154 |
| 2014/0112062 A1 | 4/2014 | Trivedi et al. | |
| 2015/0085568 A1* | 3/2015 | Gulati | G11C 11/419 |
| | | | 365/156 |
| 2017/0032835 A1* | 2/2017 | Liaw | G11C 11/419 |

OTHER PUBLICATIONS

Japanese Office Action dated Aug. 20, 2019, in Japanese Patent Application No. 2018-500988 with an English translation.
European Search Report dated Sep. 19, 2019, in European Patent Application No. 16891609.6-1203/3422350.

* cited by examiner

FIG.6
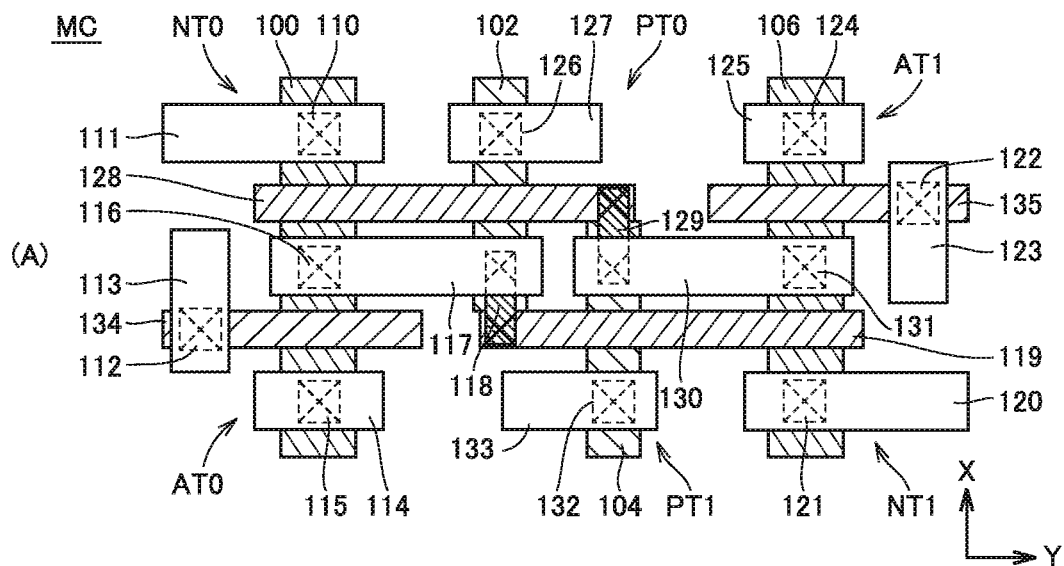
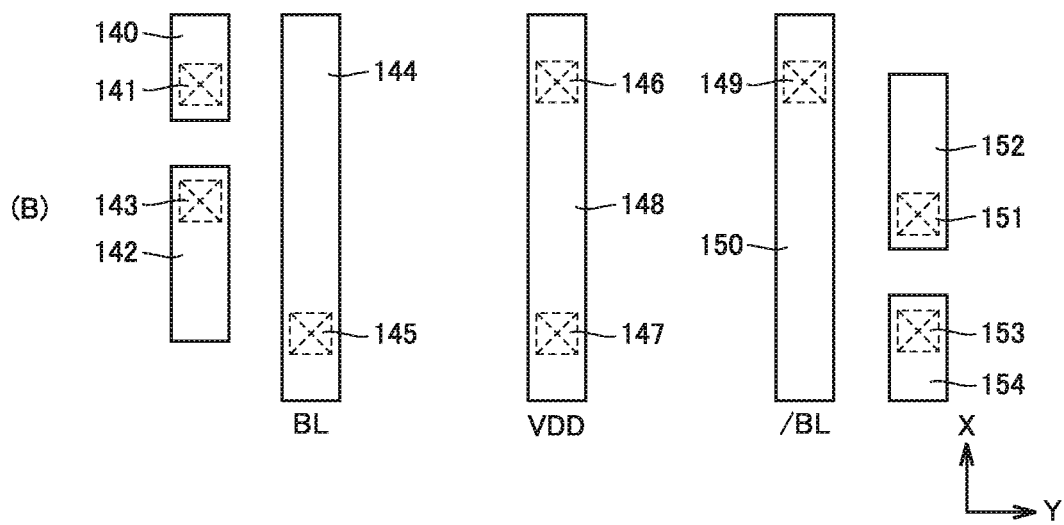

FIG.7
(A)
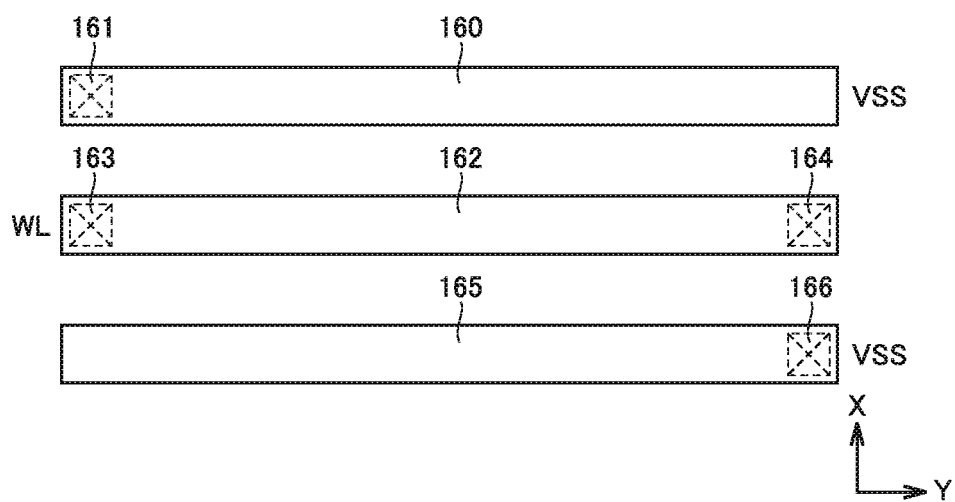
(B)
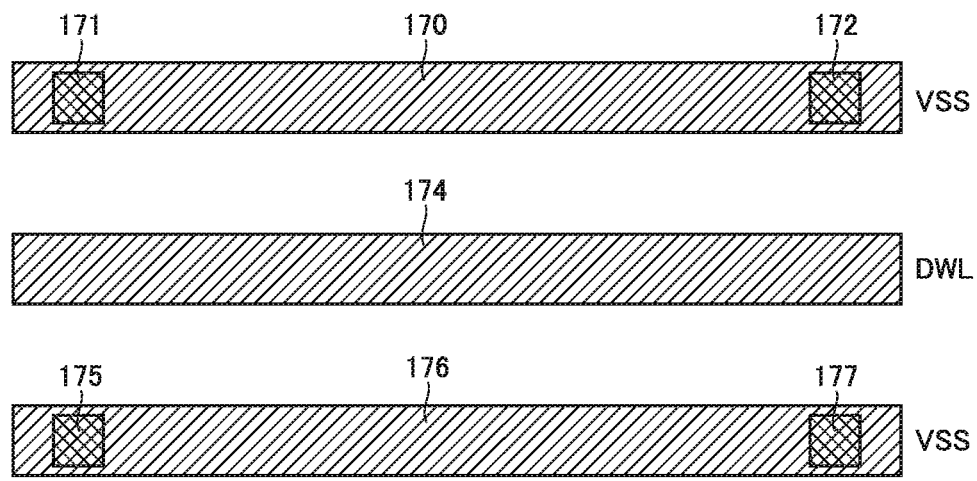

FIG.9
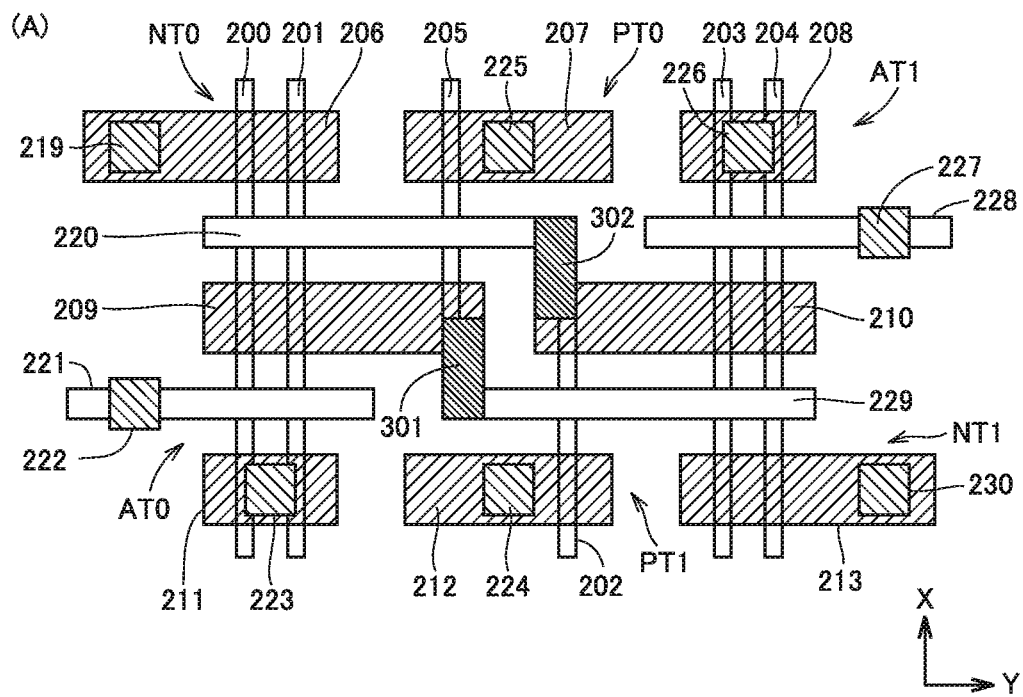
(A)
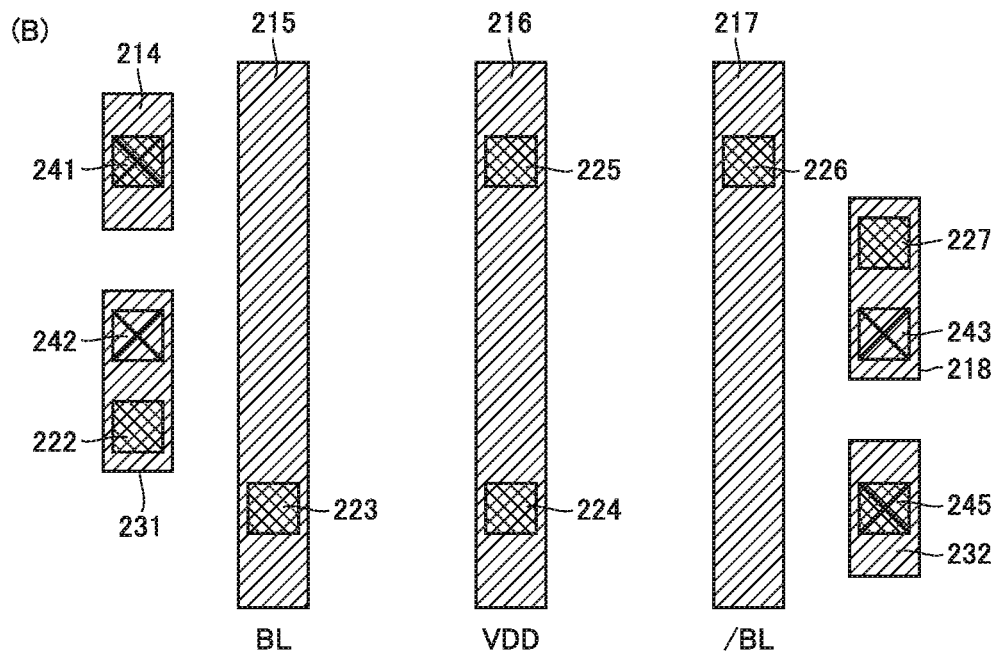
(B)

FIG.10
(A)
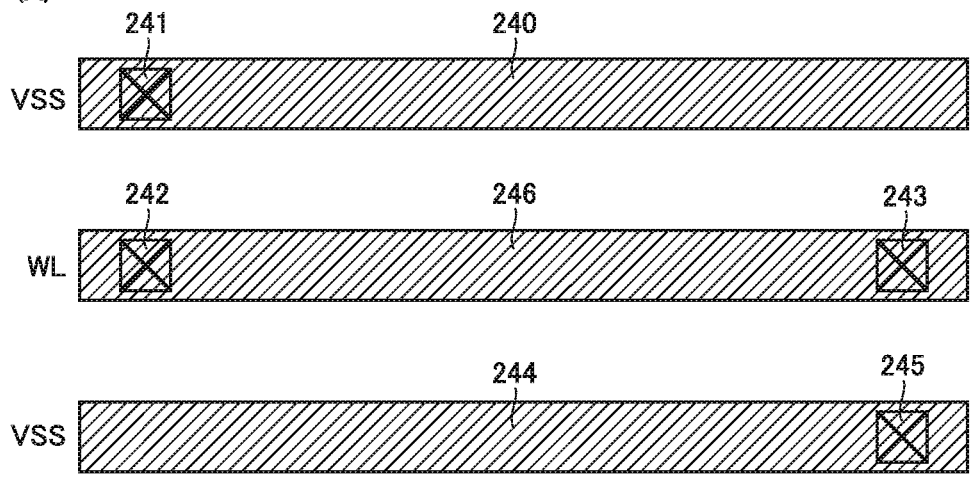
(B)
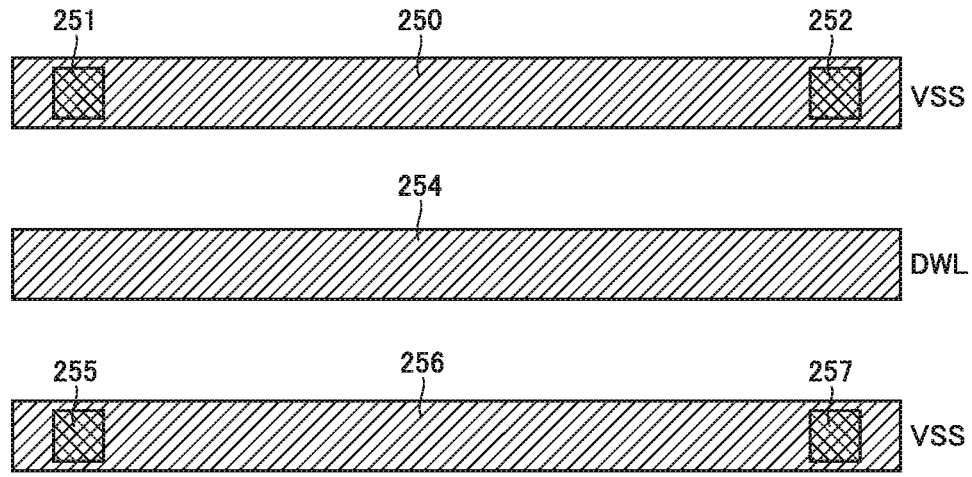

US 10,658,028 B2

SEMICONDUCTOR STORAGE DEVICE INCLUDING MEMORY CELLS, WORD DRIVER, DUMMY WORD DRIVER

TECHNICAL FIELD

The present disclosure relates to a semiconductor storage device, more specifically relates to a boosting circuit.

BACKGROUND ART

In general, a boosting circuit generates a boosted voltage exceeding the applied power supply voltage level and is used in various circuits in a semiconductor integrated circuit device.

Patent Document 1 proposes a boosting circuit applicable to a semiconductor memory such as a dynamic random access memory (hereinafter referred to as "DRAM") and a static random access memory (hereinafter referred to as "SRAM").

CITATION LIST

Patent Document

PTD 1: Japanese Patent Laying-Open No. 06-187788

SUMMARY OF INVENTION

Technical Problem

In the system according to Patent Document 1, a boosting capacitive element with a large capacity needs to be separately provided for increasing voltage on a word line, and its layout needs to be devised.

The present invention is made to solve the problem above and aims to provide a semiconductor storage device capable of efficiently increasing voltage on a word line in a simple system.

Solution to Problem

According to an embodiment, a semiconductor storage device includes a plurality of memory cells arranged in a matrix, a word line provided corresponding to a memory cell row, a dummy word line formed in a metal interconnection layer adjacent to a metal interconnection layer in which the word line is formed, a word driver circuit configured to drive the word line, and a dummy word driver circuit configured to increase voltage on the word line based on interline capacitance between the word line and the dummy word line.

Other problems and new features will become apparent in conjunction with the description and the accompanying drawings.

Advantageous Effects of Invention

According to an embodiment, the voltage on a word line can be increased with a simple system based on interline capacitance between the word line and a dummy word line.

BRIEF DESCRIPTION OF DRAWINGS

FIG. 6 is a diagram illustrating a (first) layout configuration of memory cell MC of memory array MA including planar transistors based on the first embodiment.

FIG. 7 is a diagram illustrating a (second) layout configuration of memory cell MC of memory array MA based on the first embodiment.

FIG. 9 is a diagram illustrating a (first) layout configuration of memory cell MC # of memory array MA including fin FETs based on the first embodiment.

FIG. 10 is a diagram illustrating a (second) layout configuration of a memory cell MC # of memory array MA including fin FETs based on the first embodiment.

DESCRIPTION OF EMBODIMENTS

Figure 1:
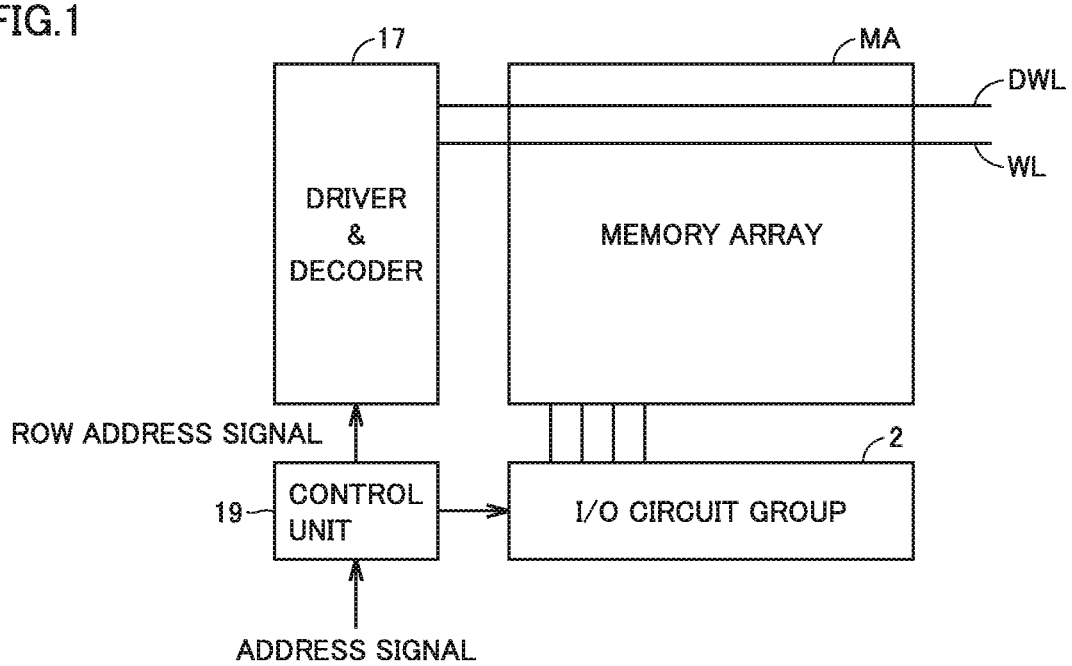
FIG. 1 is an external configuration diagram of a semiconductor storage device based on a first embodiment.

Embodiments will be described in detail with reference to the drawings. In the drawings, the same or corresponding parts are denoted by the same reference signs and a description thereof will not be repeated.

First Embodiment

FIG. 1 is an external configuration diagram of a semiconductor storage device based on a first embodiment.

As shown in FIG. 1, the semiconductor storage device includes a driver&decoder 17, a memory array MA, a control unit 19, and an I/O circuit group 2. The decoder is a simplified form of an address decoder.

Control unit 19 controls the functional blocks of the semiconductor storage device. Specifically, control unit 19 outputs a row address signal to driver&decoder 17 based on input of an address signal. Control unit 19 also outputs a variety of signals for driving I/O circuit group 2.

Memory array MA has a plurality of memory cells arranged in a matrix. The memory cells of memory array MA are rewritable.

In the present example, a plurality of word lines WL corresponding to memory cell rows and a plurality of dummy word lines DWL parallel to a plurality of word lines WL are provided.

Driver&decoder 17 drives word lines WL and dummy word lines DWL corresponding to memory cell rows of memory cells arranged in a matrix of memory array MA.

I/O circuit group 2 is provided as input/output circuitry including a plurality of I/O circuits for performing data read or data write on memory array MA.

Figure 2:
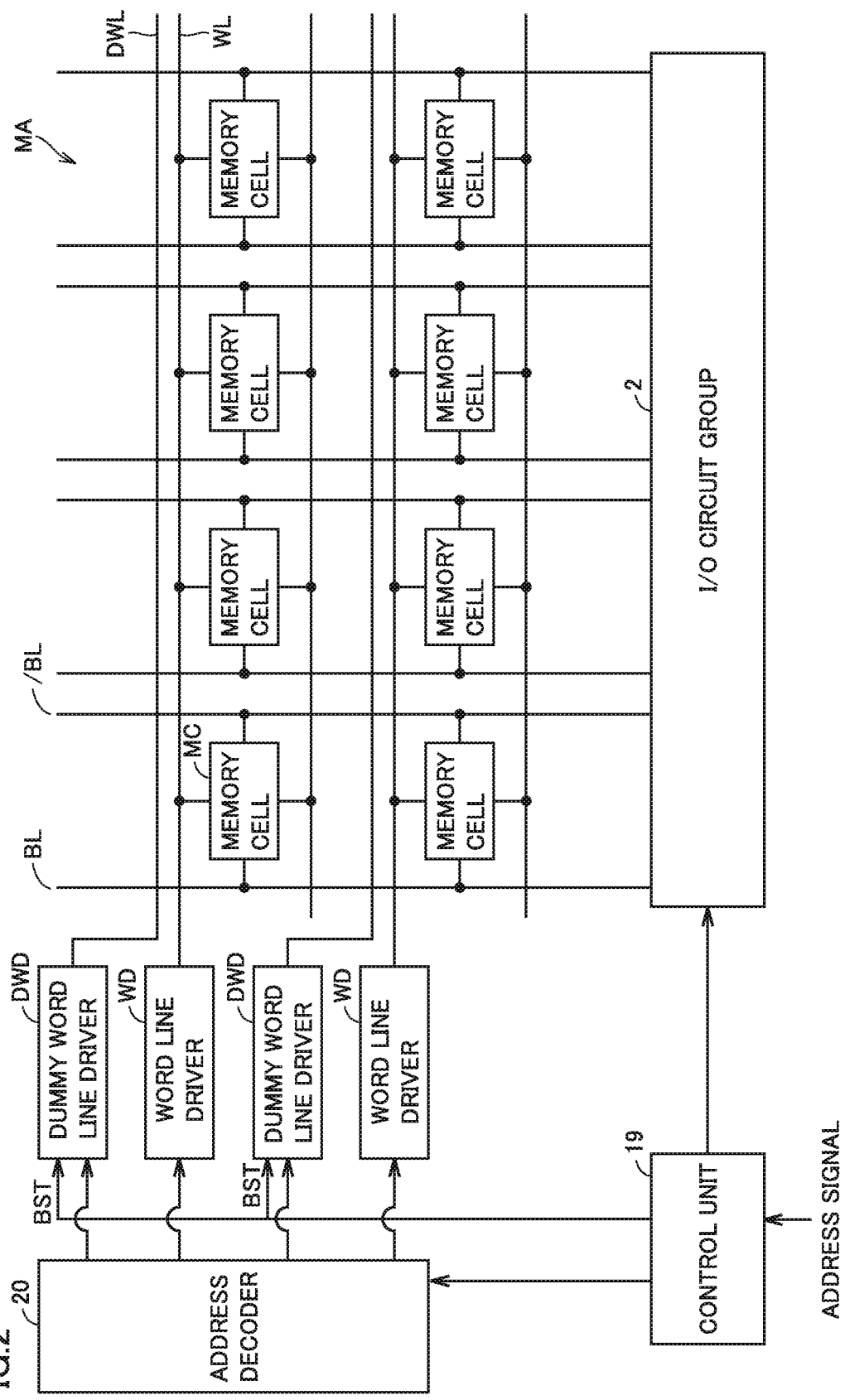
FIG. 2 is a diagram illustrating a configuration of a memory array MA and a peripheral circuit based on the first embodiment.

FIG. 2 is a diagram illustrating a configuration of memory array MA and a peripheral circuit based on the first embodiment.

As shown in FIG. 2, in the present example, a configuration of memory array MA and a driver driving word lines WL and dummy word lines DWL provided in memory array MA will be described.

Memory array MA has a plurality of memory cells MC arranged in a matrix. Each memory cell MC is a static memory cell including drive transistors, transfer transistors, and load elements, which will be described later.

In the present example, memory cells MC in two rows and four columns are shown by way of example.

A plurality of word lines WL are provided corresponding to the memory cell rows of memory array MA.

A plurality of dummy word lines DWL are also provided corresponding to the memory cell rows of memory array MA.

Driver&decoder 17 is configured with a word line driver WD provided corresponding to word line WL, a dummy word line driver DWD provided corresponding to dummy word line DWL, and an address decoder 20.

Address decoder 20 decodes a row address signal and outputs a decode signal to word line driver WD. Word line driver WD activates word line WL selected in accordance with the decode signal based on the row address signal.

Control unit 19 outputs a control signal BST for increasing the voltage on word line WL to dummy word line driver DWD.

Address decoder 20 decodes a row address signal and outputs a decode signal to dummy word line driver DWD. Dummy word line driver DWD drives dummy word line DWL in accordance with the decode signal based on the row address signal and control signal BST.

A plurality of bit line pairs BL, /BL are provided corresponding to the memory cell columns of memory array MA. In the present example, four memory cell columns are shown. Four bit line pairs are provided corresponding to four memory cell columns.

I/O circuit group 2 includes a select circuit for selecting one of four columns, a sense amplifier, a write driver, and a bit line precharge circuit.

Figure 3:
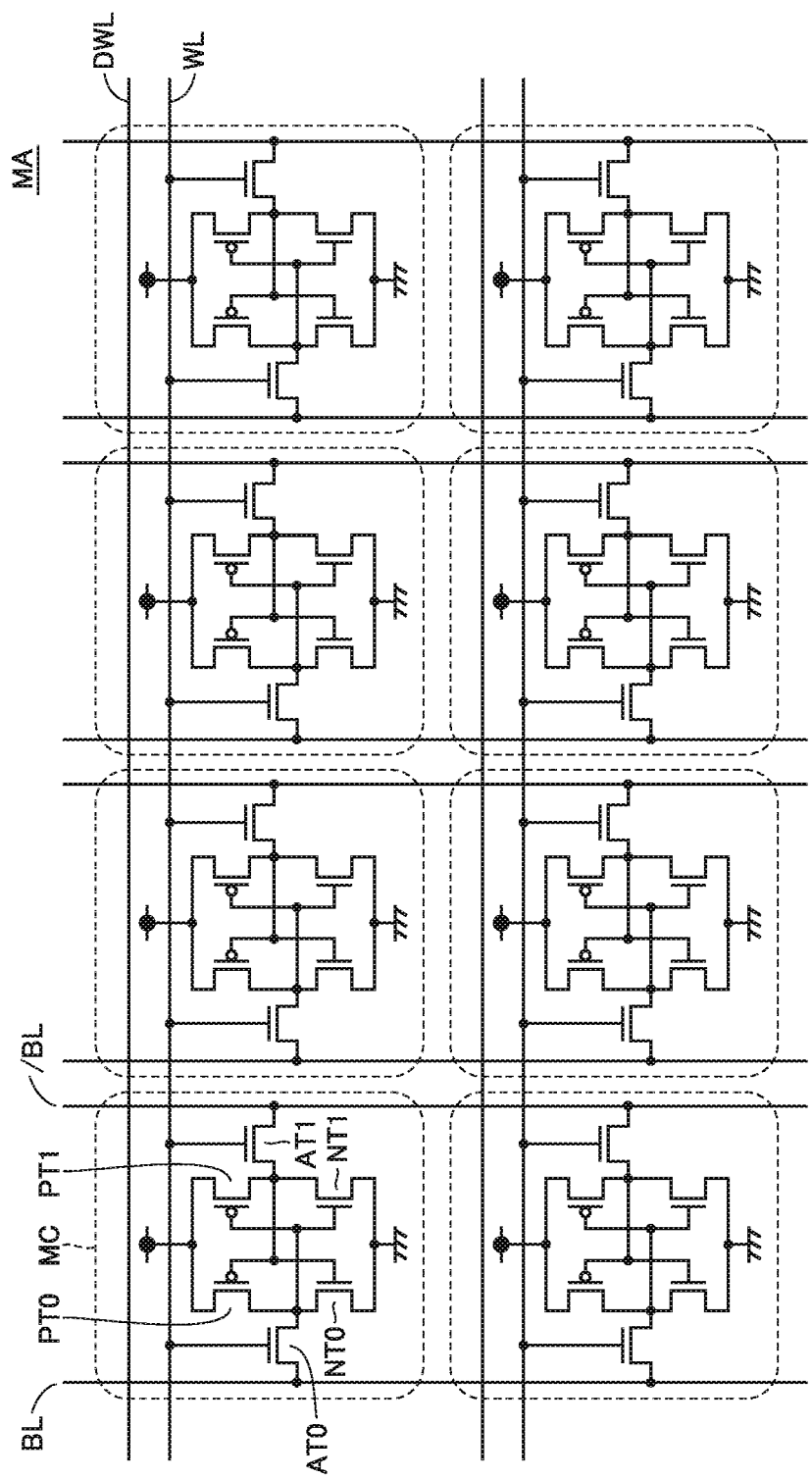
FIG. 3 is a diagram illustrating a configuration of memory array MA based on the first embodiment.

FIG. 3 is a diagram illustrating a configuration of memory array MA based on the first embodiment.

FIG. 3 shows a configuration of memory cell MC. Memory cell MC includes two transfer transistors AT0, AT1, drive transistors NT0, NT1, and load transistors PT0, PT1 (load elements).

Transfer transistors AT0, AT1 are electrically connected to a corresponding word line WL. Transfer transistors AT0, AT1 are rendered conductive in accordance with word line WL activated when data read or data write on memory cell MC is performed.

Figure 4:
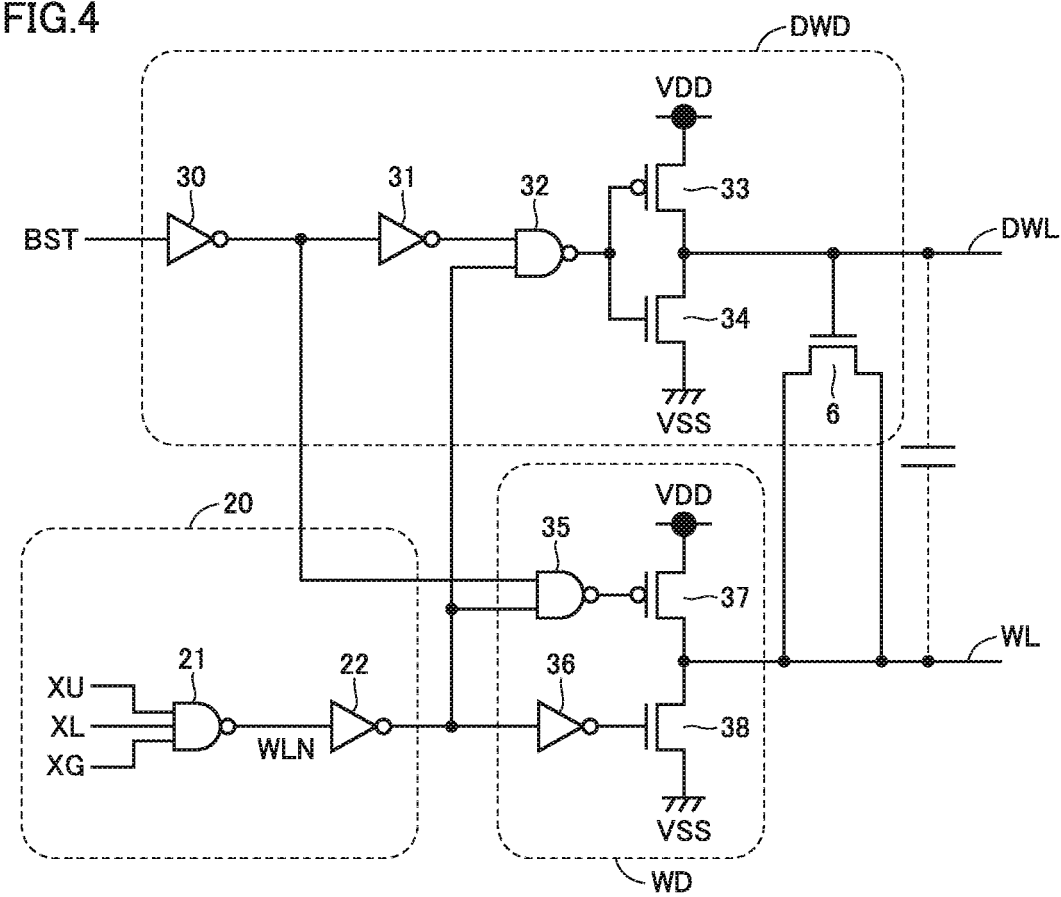
FIG. 4 is a diagram illustrating a circuit configuration of the peripheral circuit based on the first embodiment.

Dummy word line DWL is arranged in parallel with word line WL. FIG. 4 is a diagram illustrating a circuit configuration of the peripheral circuit based on the first embodiment.

As shown in FIG. 4, word line driver WD, dummy word line driver DWD, and address decoder 20 are shown here.

Address decoder 20 includes a NAND circuit 21 and an inverter 22.

NAND circuit 21 receives input of row address signals XU, XL, XG and outputs the result of the NANDN operation as a decode signal WLN.

Address decoder 20 outputs an inversion signal of decode signal WLN through inverter 22 to dummy word line driver DWD and word line driver WD.

Word line driver WD includes a NAND circuit 35, an inverter 36, a P-channel MOS transistor 37, and an N-channel MOS transistor 38.

P-channel MOS transistor 37 and N-channel MOS transistor 38 are provided between power supply voltage VDD and ground voltage VSS, and the connection node thereof is connected to word line WL.

The gate of P-channel MOS transistor 37 receives input of an output signal of NAND circuit 35. The gate of N-channel MOS transistor 38 receives input of decode signal WLN through inverters 22 and 36. NAND circuit 35 receives input of an inversion signal of control signal BST through inverter 30 and an inversion signal of decode signal WLN through inverter 22 and outputs the result of the NAND operation to the gate of P-channel MOS transistor 37.

Dummy word line driver DWD includes inverters 30, 31, a NAND circuit 32, a P-channel MOS transistor 33, an N-channel MOS transistor 34, and a capacitive element 6.

Inverter 30 receives input of control signal BST and outputs an inversion signal thereof to inverter 31 and one of the input nodes of NAND circuit 35.

NAND circuit 32 receives input of control signal BST through inverters 30, 31 and input of an inversion signal of decode signal WLN through inverter 22 and outputs the result of the NAND operation.

P-channel MOS transistor 33 and N-channel MOS transistor 34 are provided between power supply voltage VDD and ground voltage VSS, and the connection node thereof is connected to dummy word line DWL. The gates of P-channel MOS transistor 33 and N-channel MOS transistor 34 receive input of an output signal of NAND circuit 32.

Capacitive element 6 is formed with an N-channel MOS transistor. The source and the drain of the N-channel MOS transistor are connected to word line WL. The gate is connected to dummy word line DWL. Capacitive element 6 may be formed with a P-channel MOS transistor.

In the initial state, decode signal WLN is set to "H" level. Accordingly, the gate of N-channel MOS transistor 38 is set to "H" level. N-channel MOS transistor 38 enters an ON state, and word line WL is connected to ground voltage VSS.

Control signal BST has been set to "L" level. Accordingly, NAND circuit 32 outputs a signal at "H" level. Consequently, N-channel MOS transistor 34 enters an ON state, and dummy word line DWL is connected to ground voltage VSS.

On the other hand, as a consequence of row address signals XU, XL, XG being set to "H" level, NAND circuit 21 sets decode signal WLN to "L" level. Consequently, the gate of N-channel MOS transistor 38 is set to "L" level. Accordingly, N-channel MOS transistor 38 enters an OFF state. NAND circuit 35 outputs a signal at "L" level to P-channel MOS transistor 37, based on an inversion signal of decode signal WLN through inverter 22 and an inversion signal of control signal BST through inverter 30. Consequently, P-channel MOS transistor 37 enters an ON state, and word line WL is connected to power supply voltage VDD. That is, word line WL is activated.

Subsequently, as a consequence of control signal BST being set to "H" level, NAND circuit 35 outputs "H" level. Consequently, P-channel MOS transistor 37 enters an OFF state, and word line WL enters a high impedance state (Hi-z).

NAND circuit 32 outputs "L" level. Consequently, P-channel MOS transistor 33 enters an ON state. Consequently, power supply voltage VDD is connected to dummy word line DWL. That is, dummy word line DWL is activated.

Capacitive element 6 is provided between dummy word line DWL and word line WL. As described above, dummy word line DWL and word line WL are arranged in parallel with each other and have capacitance between interconnections. Accordingly, when dummy word line DWL is activated based on capacitive element 6 and the capacitance between interconnections, the voltage on word line WL is increased (boosted).

Increasing the voltage on word line WL can improve the write margin and the read margin.

In the present example, a configuration in which the voltage on word line WL is increased (boosted) when dummy word line DWL is activated based on capacitive element 6 and capacitance between interconnections. However, a configuration including dummy word line DWL alone without capacitive element 6 may be employed.

Figure 5:
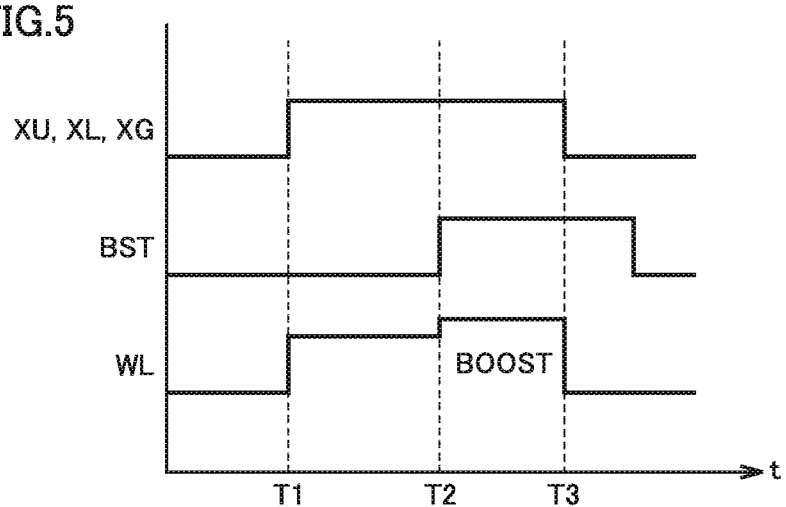
FIG. 5 is a timing chart in which word line WL is activated based on the first embodiment.

FIG. 5 is a timing chart in which word line WL is activated based on the first embodiment.

As shown in FIG. 5, at time T1, as a consequence of row address signals XU, XL, XG being set to "H" level, word line WL is activated. Subsequently, at time T2, as a consequence of control signal BST being set to "H" level, word line WL is boosted and the voltage is increased.

At time T3, as a consequence of row address signals XU, XL, XG being set to "L" level, word line WL is inactivated.

FIG. 6 is a diagram illustrating a (first) layout configuration of memory cell MC of memory array MA including planar transistors based on the first embodiment.

FIG. 6(A) shows a layout configuration of the substrate region of memory cell MC formed with interconnections (first layer), contact holes, polycrystal silicon (polysilicon), and diffusion regions.

Memory cell MC includes P-channel MOS transistors formed at the central portion. N-channel MOS transistors are also formed on both sides thereof.

Drive transistors NT0, NT1 are formed as N-channel MOS transistors. Load transistors PT0, PT1 are formed as P-channel MOS transistors. Transfer transistors AT0, AT1 are formed as N-channel MOS transistors.

Drive transistor NT0 has a source and a drain formed of an N-type diffusion region 100 and a gate 128 arranged therebetween and formed of polysilicon. N-type diffusion region 100 serving as the source of drive transistor NT0 is coupled to an interconnection 111 through a contact hole 110. Interconnection 111 is electrically coupled to ground voltage VSS through an overlying metal interconnection layer.

Transfer transistor AT0 has a source and a drain formed of N-type diffusion region 100 and a gate 134 arranged therebetween and formed of polysilicon. This gate is coupled to an interconnection 113 through a contact hole 112. Interconnection 113 is electrically coupled to word line WL through an overlying metal interconnection layer. N-type diffusion region 100 serving as the source of transfer transistor AT0 is electrically coupled to an interconnection 114 through a contact hole 115. Interconnection 114 is electrically coupled to bit line BL through an overlying metal interconnection layer.

N-type diffusion region 100 serving as the common drain of drive transistor NT0 and transfer transistor AT0 is electrically coupled to an interconnection 117 through a contact hole 116. Interconnection 117 is electrically coupled to gate 119 of load transistor PT1 through a local interconnection 118. Local interconnection 118 is also electrically coupled to a P-type diffusion region 102 serving as the drain of load transistor PT0.

Transfer transistor AT1 has a source and a drain formed of an N-type diffusion region 106 and a gate 135 arranged therebetween and formed of polysilicon. This gate 135 is coupled to an interconnection 123 through a contact hole 122. Interconnection 123 is electrically coupled to word line WL through an overlying metal interconnection layer. N-type diffusion region 106 serving as the source of transfer transistor AT1 is electrically coupled to an interconnection 125 through a contact hole 124. Interconnection 124 is electrically coupled to bit line /BL through an overlying metal interconnection layer.

Drive transistor NT1 has a source and a drain formed of N-type diffusion region 106 and a gate 119 arranged therebetween and formed of polysilicon. N-type diffusion region 106 serving as the source of N-channel MOS transistor NT1 is electrically coupled to an interconnection 120 through a contact hole 121. Interconnection 120 is electrically coupled to ground voltage VSS through an overlying metal interconnection layer.

N-type diffusion region 106 serving as the common drain of drive transistor NT1 and transfer transistor AT1 is electrically coupled to an interconnection 130 through a contact hole 131. Interconnection 130 is electrically coupled to gate 128 of load transistor PT0 through a local interconnection 129. Local interconnection 129 is also electrically coupled to P-type diffusion region 104 serving as the drain of load transistor PT1.

Load transistor PT1 has a source and a drain formed of a P-type diffusion region 104 and a gate 119 arranged therebetween and formed of polysilicon. Gate 119 is shared by drive transistor NT1. P-type diffusion region 104 serving as the source of load transistor PT1 is coupled to an interconnection 132 through a contact hole 132. Interconnection 132 is electrically coupled to power supply voltage VDD through an overlying metal interconnection layer.

Load transistor PT0 has a source and a drain formed of P-type diffusion region 102 and a gate 128 arranged therebetween and formed of polysilicon. Gate 128 is shared by drive transistor NT0. P-type diffusion region 102 serving as the source of load transistor PT0 is coupled to an interconnection 127 through a contact hole 126. Interconnection 127 is electrically coupled to power supply voltage VDD through an overlying metal interconnection layer.

FIG. 6(B) shows a layout configuration of memory cell MC formed with interconnections (second layer) and vias.

An interconnection 144 is provided along the X direction to form bit line BL. Interconnection 144 is connected to interconnection 114 through a via 145.

An interconnection 150 is provided along the X direction to form bit line /BL. Interconnection 150 is connected to interconnection 125 through a via 149.

An interconnection 148 is provided along the X direction to supply power supply voltage VDD. Interconnection 148 is connected to interconnections 127, 133 respectively through vias 146, 147.

An interconnection 142 is provided along the X direction. Interconnection 142 is connected to interconnection 113 through a via 143. Interconnection 142 is connected to word line WL through an overlying metal interconnection layer.

An interconnection 140 is provided along the X direction. Interconnection 140 is connected to interconnection 111 through a via 141. Interconnection 140 is connected to ground voltage VSS through an overlying metal interconnection layer.

An interconnection 152 is provided along the X direction. Interconnection 152 is connected to interconnection 122 through a via 151. Interconnection 152 is connected to word line WL through an overlying metal interconnection layer.

An interconnection 154 is provided along the X direction. Interconnection 154 is connected to interconnection 120 through a via 153. Interconnection 154 is connected to ground voltage VSS through an overlying metal interconnection layer.

FIG. 7 is a diagram illustrating a (second) layout configuration of memory cell MC of memory array MA based on the first embodiment.

FIG. 7(A) shows a layout configuration of memory cell MC formed with interconnections (third layer) and vias.

An interconnection 160 is provided along the Y direction to supply ground voltage VSS. Interconnection 160 is connected to interconnection 140 through a via 161.

An interconnection 162 is provided along the Y direction to form word line WL. Interconnection 162 is connected to interconnections 142, 152 respectively through vias 163, 164.

An interconnection 165 is provided along the Y direction to supply ground voltage VSS. Interconnection 165 is connected to interconnection 154 through a via 166.

FIG. 7(B) shows a layout configuration of memory cell MC formed with interconnections (fourth layer) and vias.

Interconnections 170, 176 are provided along the Y direction to supply ground voltage.

Interconnection 170 is electrically coupled to interconnection 160 through vias 171, 172.

Interconnection 176 is electrically coupled to interconnection 176 through vias 175, 177.

An interconnection 174 is also provided along the Y direction to form dummy word line DWL.

Interconnection 174 is arranged over interconnection 162.

With this configuration, capacitance between interconnections is produced between interconnection 162 and interconnection 174.

Figure 8:
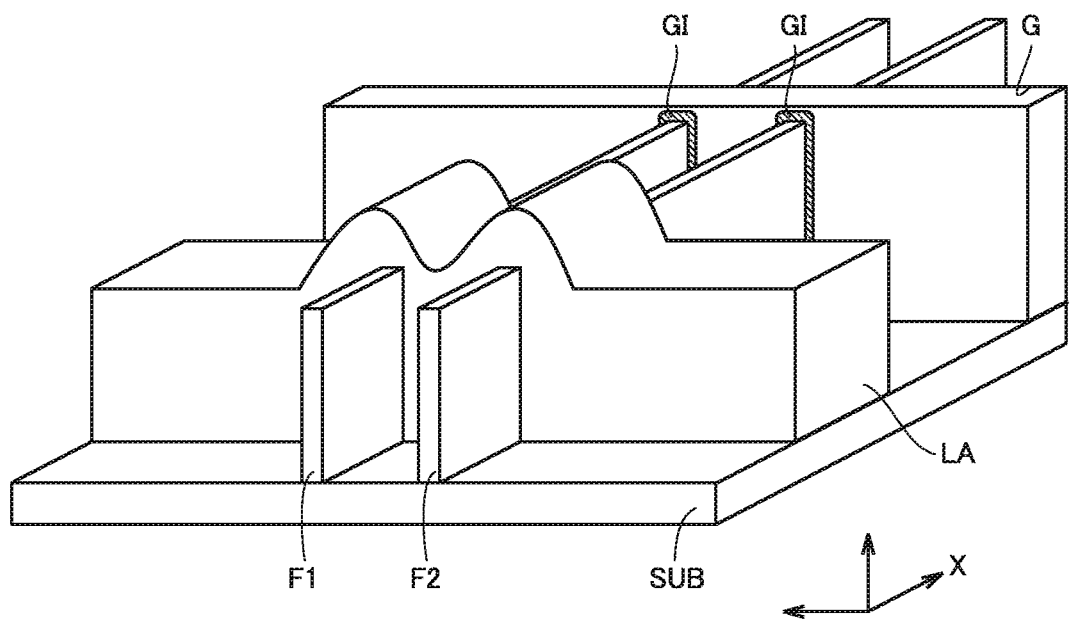
FIG. 8 is a diagram illustrating a three-dimensional structure of a fin FET based on the first embodiment.

FIG. 8 is a diagram illustrating a three-dimensional structure of a fin FET based on the first embodiment.

The structure of a memory cell MC # of memory array MA including fin transistors (fin FETs) based on the first embodiment will be described.

As shown in FIG. 8, a fin PET includes, for example, a plurality of fins F1, F2 provided on a P-type semiconductor substrate SUB. Fins F1, F2 extend in the X direction along the substrate plane. Fins F1, F2 are formed by selectively etching a surface of semiconductor substrate SUB. A silicon oxide film formed by, for example, CVD (Chemical Vapor Deposition) is provided as an element isolation film between the adjacent fins F (the portion where fins F1, F2 are not formed).

A gate electrode G is formed to cover the upper surface and side surfaces of each fin F1, F2 with a gate insulating layer GI interposed. Gate electrode G extends in the Y direction that is the direction crossing fins F1, F2. For gate electrode G, for example, semiconductor such as polycrystal silicon, a conductive compound such as titanium nitride, a simple substance metal such as tungsten, or a layered film of any of these is used.

After forming gate electrode G, an impurity is implanted in fins F using gate electrode G as a mask, whereby a source region and a drain region (not shown) are formed in a portion other than the channel region surrounded by gate electrode G. Here, when a PMOS (P-channel Metal Oxide Semiconductor) transistor is to be fabricated, fin F is formed on an N-type well, and P-type impurity is implanted into fin F. When an NMOS (N-channel MOS) transistor is to be fabricated, fin F is formed on a P-type substrate or a P-type well, and an N-type impurity is implanted into fin F.

Local interconnection (LIC: Local Inter-Connect) LA extending in the Y direction is formed, for example, using metal such as tungsten to make Ohmic-contact with the upper surfaces and the side surfaces of these source region and drain region. That is, local interconnection LA functions as a source electrode or a drain electrode. Gate interconnection G, the source electrode or the drain electrode is further directly connected to a local interconnection (not shown) extending in the X direction or is connected to an overlying metal interconnection layer (not shown) through a via hole formed in a not-shown interlayer insulating layer.

FIG. 9 is a diagram illustrating a (first) layout configuration of memory cell MC # of memory array MA including fin FETs based on the first embodiment.

FIG. 9(A) shows a layout configuration of the substrate region of memory cell MC # formed with interconnections (first layer), vias and local interconnections, polycrystal silicon (polysilicon), and fins.

Memory cell MC # includes P-channel MOS transistors at the central portion. N-channel MOS transistors are formed on both sides thereof.

Drive transistor NT0 has fins 200 and 201.

Fins 200 and 201 are formed to be three-dimensionally standing in the same manner as the gate electrode. Drive transistor NT0 has a source and a drain, and a gate 220 arranged therebetween and formed of polysilicon. Fins 200 and 201 are coupled to a local interconnection 206 serving as the source of drive transistor NT0. Local interconnection 206 is electrically coupled to an interconnection 214 through a via 219. Interconnection 214 is electrically coupled to ground voltage VSS through an overlying metal interconnection layer.

Transfer transistor AT0 shares fins 200 and 201 with drive transistor NT0. Transfer transistor AT0 has a source and a drain, and a gate 221 arranged therebetween and formed of polysilicon. Fins 200, 201 serving as the source of transfer transistor AT0 are coupled to a local interconnection 211. Local interconnection 211 is electrically coupled to an interconnection 215 that forms bit line BL through a via 223. Gate 221 is coupled to an interconnection 231 through a via 222. Interconnection 231 is electrically coupled to word line WL through an overlying metal interconnection layer.

Fins 200, 201 serving as the common drain of drive transistor NT0 and transfer transistor AT0 are electrically coupled to a local interconnection 209. Local interconnection 209 is electrically coupled to gate 229 of load transistor PT1 through a local interconnection 301. Local interconnection 209 is also electrically coupled to a fin 205 serving as the drain of load transistor PT0.

Transfer transistor AT1 has fins 203 and 204.

Fins 203 and 204 are formed to be three-dimensionally standing in the same manner as the gate electrode. Transfer transistor AT1 has a source and a drain, and a gate 228 arranged therebetween and formed of polysilicon. Fins 203, 204 serving as the source of transfer transistor AT1 are coupled to a local interconnection 208. Local interconnection 208 is electrically coupled to an interconnection 217 that forms bit line /BL through a via 226.

Drive transistor NT1 shares fins 203 and 204 with transfer transistor AT1.

Drive transistor NT1 has a source and a drain, and a gate 229 arranged therebetween and formed of polysilicon. Fins 203, 204 serving as the source of drive transistor NT1 are coupled to a local interconnection 213. Local interconnection 213 is electrically coupled to an interconnection 232 through a via 230. Interconnection 232 is electrically coupled to ground voltage VSS through an overlying metal interconnection layer.

Fins 203, 204 serving as the common drain of drive transistor NT1 and transfer transistor AT1 are electrically coupled to a local interconnection 210. Local interconnection 210 is electrically coupled to gate 220 of load transistor PT0 through a local interconnection 302. Local interconnection 210 is also electrically coupled to a fin 202 serving as the drain of load transistor PT1.

Load transistor PT0 has a source and a drain formed of a fin 205, and a gate 220 arranged therebetween and formed of polysilicon. Gate 220 is shared by drive transistor NT0. Fin 205 serving as the source of load transistor PT0 is electrically coupled to a local interconnection 207. Local interconnection 207 is electrically coupled to an interconnection 216 receiving supply of power supply voltage VDD through a via 225.

Load transistor PT1 has a source and a drain formed of fin 202, and a gate 229 arranged therebetween and formed of polysilicon. Gate 229 is shared by drive transistor NT1. Fin 202 serving as the source of load transistor PT1 is electrically coupled to a local interconnection 212. Local interconnection 212 is electrically coupled to interconnection 216 receiving supply of power supply voltage VDD through a via 224.

FIG. 10 is a diagram illustrating a (second) layout configuration of memory cell MC # of memory array MA including fin FETs based on the first embodiment.

FIG. 10(A) shows a layout configuration of memory cell MC # formed with interconnections (second layer) and vias.

Interconnections 240, 244 are provided along the Y direction to supply ground voltage.

Interconnection 240 is electrically coupled to interconnection 214 through a via 241.

Interconnection 244 is electrically coupled to interconnection 232 through a via 245.

An interconnection 246 is provided along the Y direction to form word line WL.

Interconnection 246 is electrically coupled to interconnection 231 through a via 242. Interconnection 246 is also electrically coupled to interconnection 218 through a via 243.

With this configuration, when memory cell MC # in FIG. 7 is used, the layout can be formed with metal interconnection layers, one layer fewer than that of memory cell MC in FIG. 6.

FIG. 10(B) shows a layout configuration of memory cell MC formed with interconnections (third layer) and vias.

Interconnections 250, 256 are provided along the Y direction to supply ground voltage.

Interconnection 250 is electrically coupled to interconnection 240 through vias 251, 252.

Interconnection 256 is electrically coupled to interconnection 244 through vias 255, 257.

An interconnection 254 is additionally provided along the Y direction to form dummy word line DWL.

Interconnection 254 is arranged over interconnection 246.

With this configuration, capacitance between interconnections is produced between interconnection 246 and interconnection 254.

Figure 11:
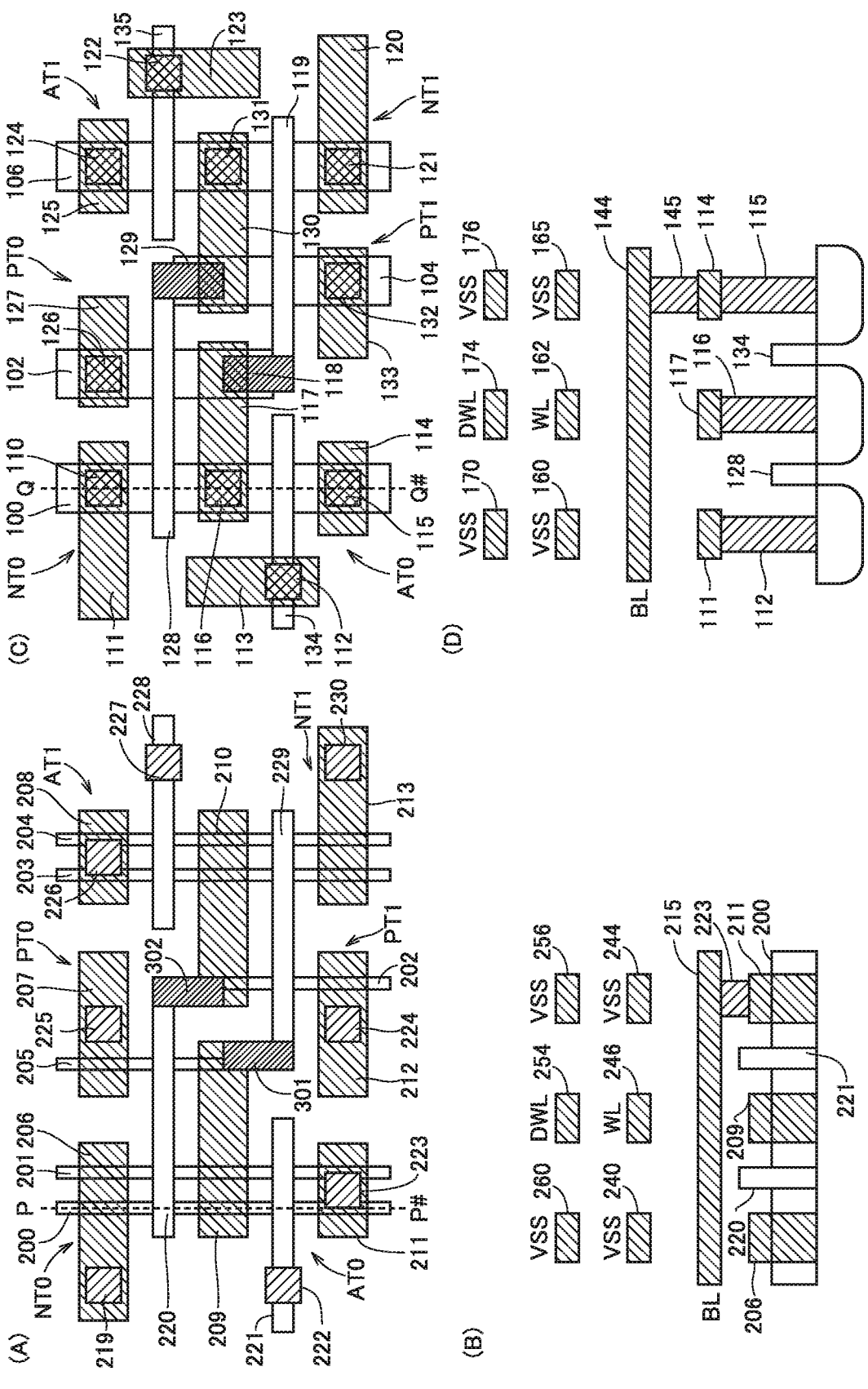
FIG. 11 is a diagram for explaining the cross-sectional structures (the X direction) of memory cells MC and MC # based on the first embodiment.

FIG. 11 is a diagram for explaining the cross-sectional structures (the X direction) of memory cells MC and MC # based on the first embodiment.

FIG. 11(A) and FIG. 11(B) are diagrams for explaining the cross-sectional structure (the X direction) of memory cell MC # including fin FETs.

FIG. 11(C) and FIG. 11(D) are diagrams for explaining the cross-sectional structure (the X direction) of memory cell MC including planar transistors.

FIG. 11(A) is similar to the layout structure of FIG. 9(A) and a detailed description thereof will not be repeated.

Referring to FIG. 11(B), the cross-sectional structure in the X direction taken along line P-P # in FIG. 11(A) is shown.

In memory cell MC # including fin FETs, bit line BL is formed using an interconnection (first layer), and word line WL and ground line VSS are formed using interconnections (second layer). Furthermore, dummy word line DWL is formed using an interconnection (third layer).

FIG. 11(C) is similar to the layout structure in FIG. 6(A) and a detailed description thereof will not be repeated.

Referring to FIG. 11(D), the cross-sectional structure in the X direction taken along line Q-Q # in FIG. 11(C) is shown.

In memory cell MC including planar transistors, bit line BL is formed using an interconnection (second layer), and word line (WL) and ground line VSS are formed using interconnections (third layer). Furthermore, dummy word line DWL is formed using an interconnection (fourth layer).

Figure 12:
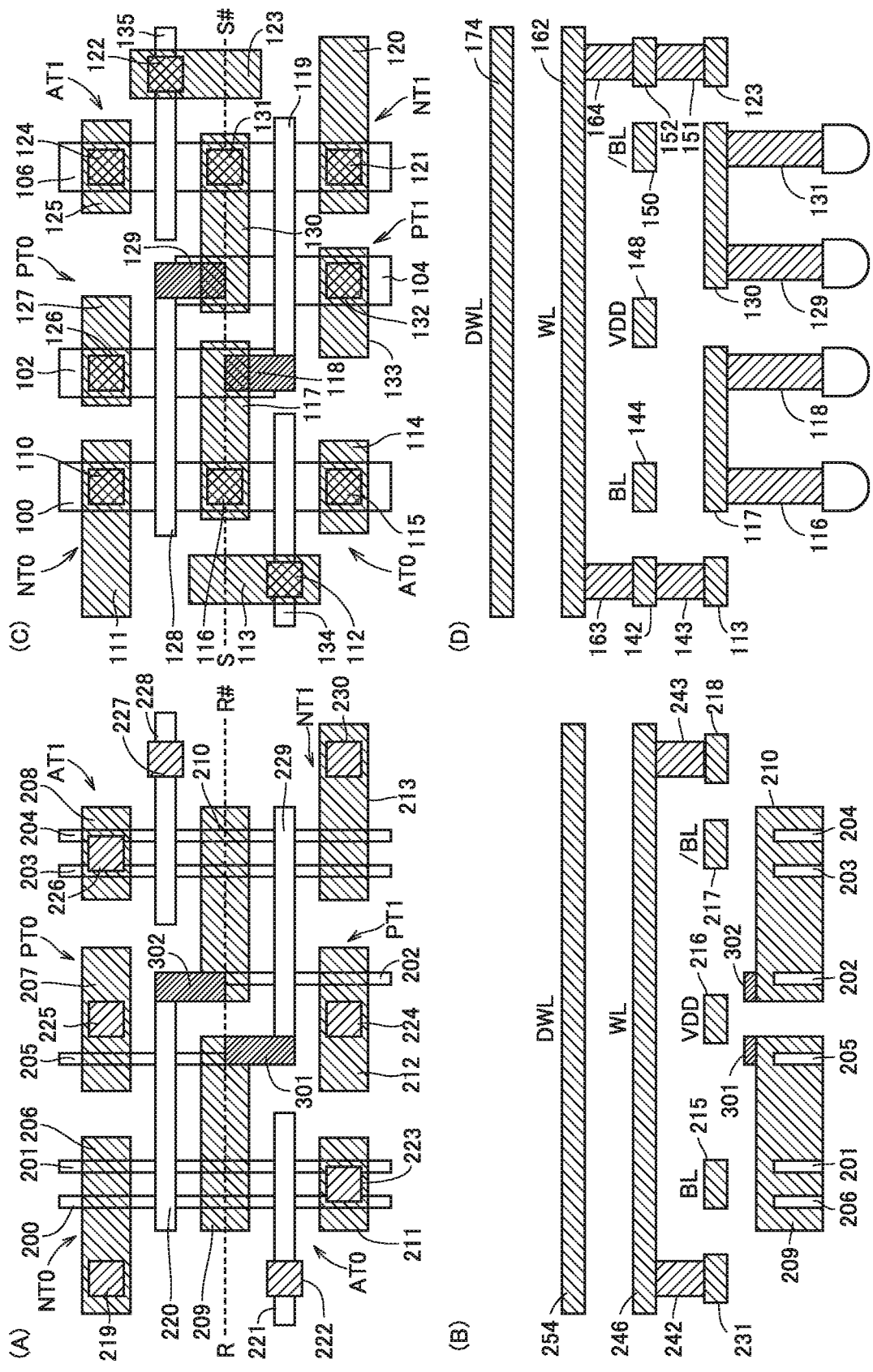
FIG. 12 is a diagram for explaining the cross-sectional structures (the Y direction) of memory cells MC and MC # based on the first embodiment.

FIG. 12 is a diagram for explaining the cross-sectional structures (the Y direction) of memory cells MC and MC # based on the first embodiment.

FIG. 12(A) and FIG. 12(B) are diagrams for explaining the cross-sectional structure (the Y direction) of memory cell MC # including fin FETs.

FIG. 12(C) and FIG. 12(D) are diagrams for explaining the cross-sectional structure (the Y direction) of memory cell MC including planar transistors.

FIG. 12(A) is similar to the layout structure in FIG. 9(A) and a detailed description thereof will not be repeated.

Referring to FIG. 12(B), the cross-sectional structure in the Y direction taken along line R-R # in FIG. 12(A) is shown.

In memory cell MC # including fin FETs, bit line BL and power supply line VDD are formed using interconnections (first layer), and word line (WL) is formed using an interconnection (second layer). Furthermore, dummy word line DWL is formed using an interconnection (third layer).

FIG. 12(C) is similar to the layout structure in FIG. 6(A) and a detailed description thereof will not be repeated.

Referring to FIG. 12(D), the cross-sectional structure in the Y direction taken along line S-S # in FIG. 12(C) is shown.

In memory cell MC including planar transistors, bit line BL and power supply line VDD are formed using interconnections (second layer), and word line (WL) and ground line VSS are formed using interconnections (third layer). Furthermore, dummy word line DWL is formed using an interconnection (fourth layer).

In memory cell MC including planar transistors, interconnections 111, 117, 114, etc. are formed using the first layer, whereas in memory cell MC # including fin FETs, the corresponding interconnections 206, 209, 211, etc. are formed using the local interconnections arranged on the side of the gates below the first layer.

Thus, in memory cell MC #, bit line BL and power supply line VDD can be formed using the interconnections on the first layer.

Accordingly, in the configuration of memory cell MC # including fin FETs, the number of interconnection layers can be reduced compared with memory cell MC including planar transistors.

Figure 13:
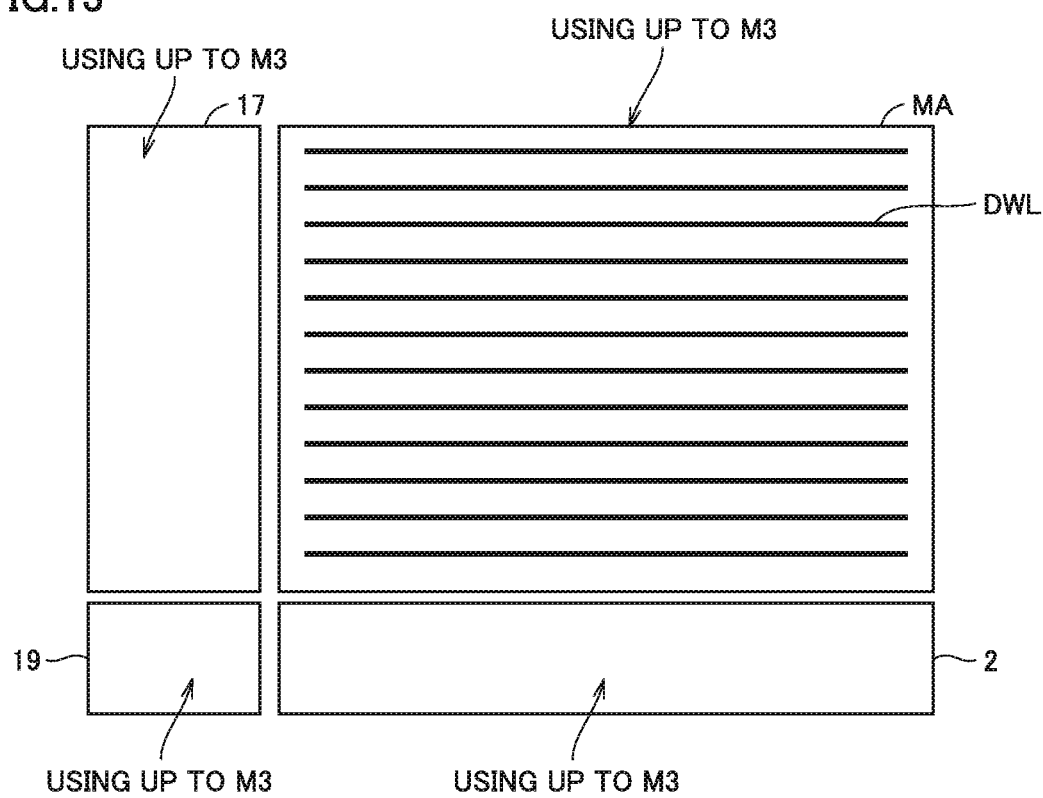
FIG. 13 is a schematic diagram illustrating the relation of metal interconnection layers based on the first embodiment.

FIG. 13 is a schematic diagram illustrating the relation of metal interconnection layers based on the first embodiment.

As shown in FIG. 13, a description will be given, taking the semiconductor storage device in FIG. 1 as an example.

Driver&decoder 17, control unit 19, and I/O circuit group 2 are formed using the layout of metal interconnection layers up to the third layer (M3).

When memory cell MC # is used, memory array MA can be formed using the layout of metal interconnection layers up to the third layer (M3).

In the first embodiment, dummy word line DWL is formed using the metal interconnection layer of the third layer (M3), by way of example.

In this configuration, when memory cell MC # is used, dummy word line DWL according to the present first embodiment can be formed without increasing the number of interconnection layers.

(First Modification)

Figure 14:
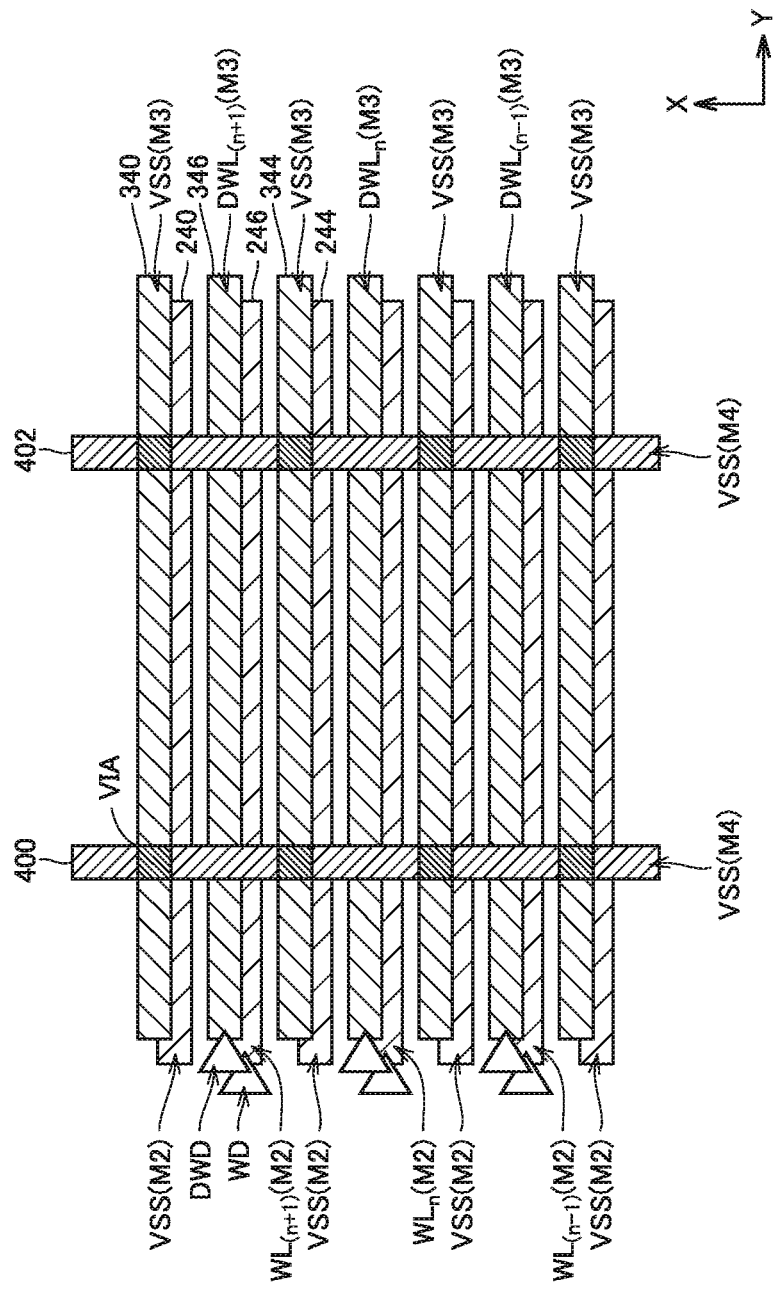
FIG. 14 is a diagram illustrating a layout configuration of memory cell MC # with interconnections (second layer to fourth layer) based on a modification of the first embodiment.

FIG. 14 is a diagram illustrating the layout configuration of memory cell MC # with interconnections (second layer to fourth layer) based on a modification of the first embodiment.

As shown in FIG. 14, an interconnection (third layer) 346 that forms dummy word line DWL in the metal interconnection layer (third layer) is provided above interconnection (second layer) 246 that forms word line WL along the Y direction. Interconnection 346 that forms dummy word line DWL along the Y direction is arranged in parallel with the interconnection that forms word line WL.

Dummy word line DWL and word line are arranged adjacent to each other in parallel whereby the interline capacitance can be increased.

In this configuration, dummy word line DWL can be arranged without further adding a metal interconnection layer in the semiconductor storage device as a whole.

Interconnections (third layer) 340, 344 for supplying ground voltage VSS are provided alternately with interconnection 346 along the Y direction. These interconnections are provided above interconnections (second layer) 240, 244 for supplying ground voltage VSS. Interconnections 340, 344 are electrically coupled to interconnections 240, 244 on the second layer through interconnection vias VIA. Furthermore, interconnections 400, 402 for supplying ground voltage VSS are provided on the metal interconnection layer (fourth layer) along the X direction. Interconnections 400, 402 are electrically coupled to interconnections 340, 344, etc. on the third layer through interconnection vias VIA.

The interconnections are provided to supply ground voltage VSS to word line WL and dummy word line DWL alternately, so that word line WL and dummy word line DWL are surrounded by the interconnections arranged along the Y direction for supplying ground voltage VSS.

Thus, word line WL and dummy word line DWL can be shielded from disturbance (noise) and can be operated stably.

(Second Modification)

Figure 15:
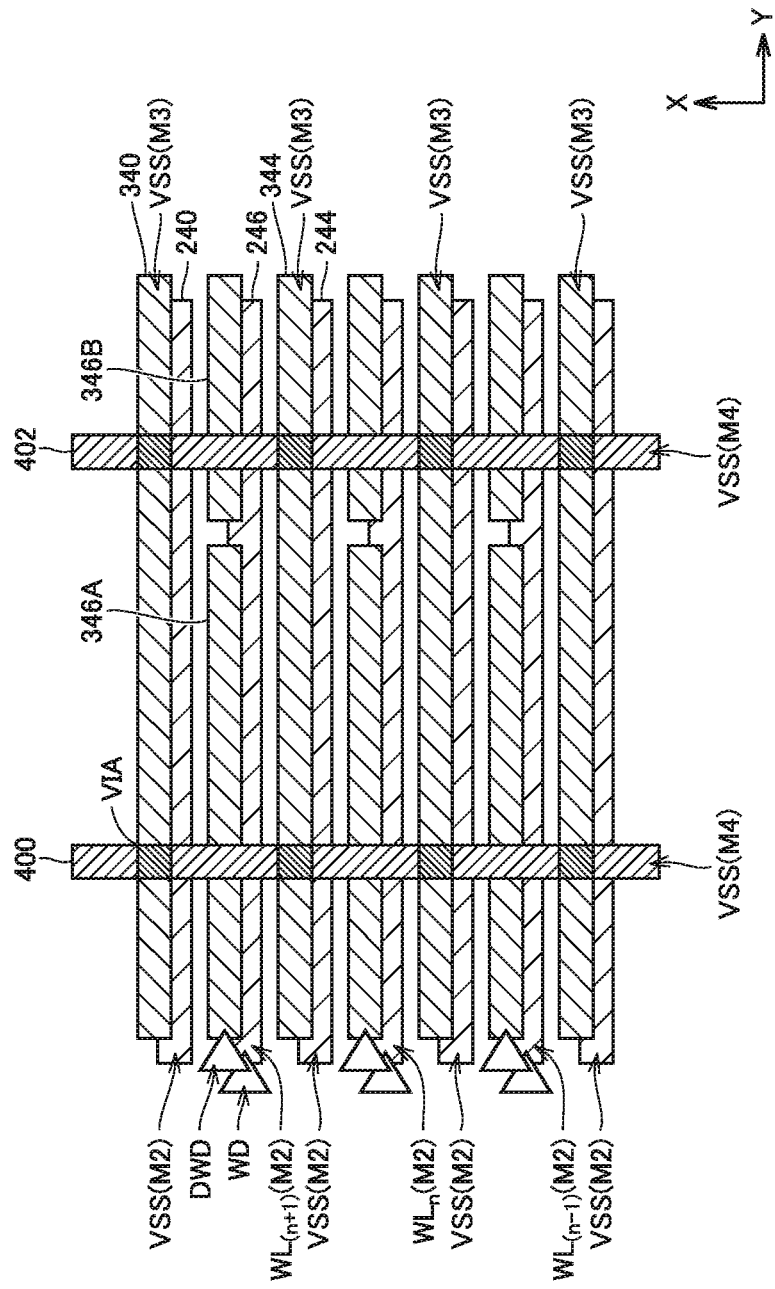
FIG. 15 is a diagram illustrating a layout configuration of memory cell MC # with interconnections (second layer to fourth layer) based on a second modification of the first embodiment.

FIG. 15 is a diagram illustrating a layout configuration of memory cell MC # with interconnections (second layer to fourth layer) based on a second modification of the first embodiment.

As shown in FIG. 15, the interconnection length of dummy word line DWL is changed, compared with the configuration in FIG. 14.

Specifically, interconnection 346 is divided into an interconnection 346A and an interconnection 346B.

The interconnection length of dummy word line DWL is adjusted whereby the interline capacitance between dummy word line DWL and word line WL can be adjusted.

(Third Modification)

Figure 16:
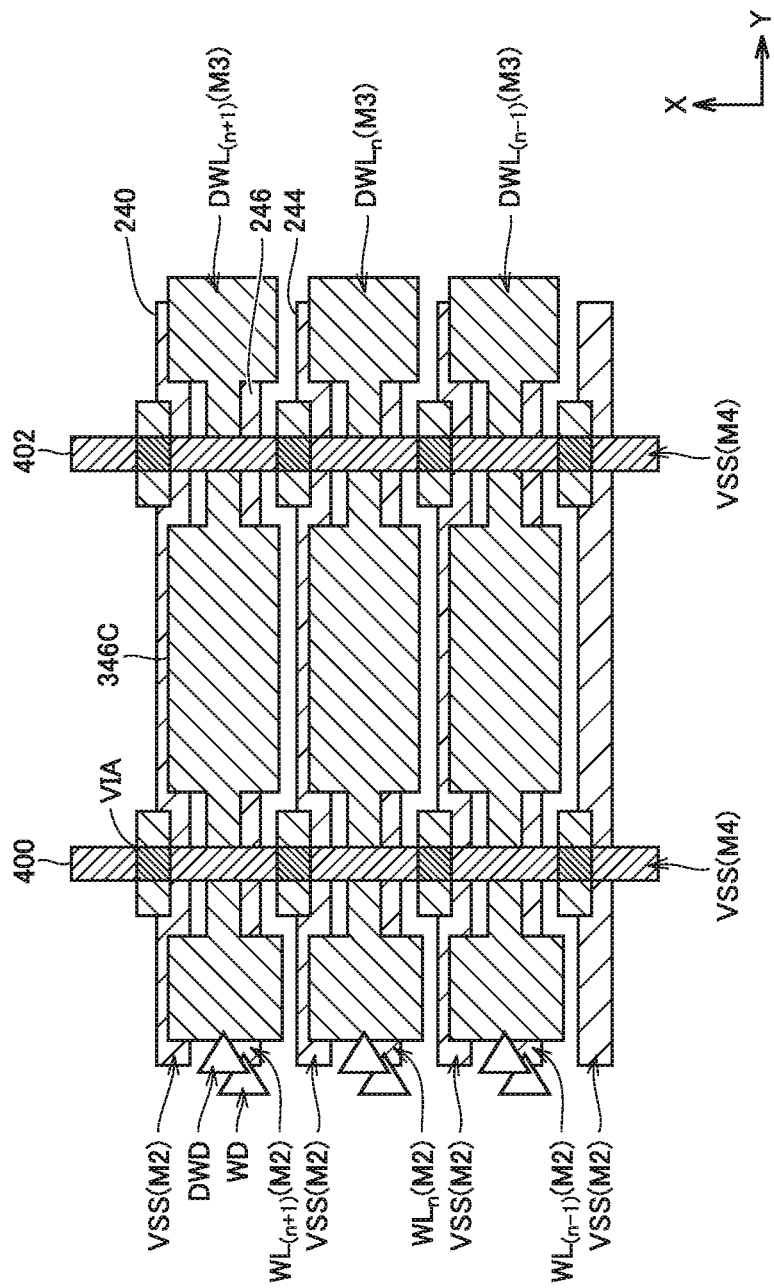
FIG. 16 is a diagram illustrating a layout configuration of memory cell MC # with interconnections (second layer to fourth layer) based on a third modification of the first embodiment.

FIG. 16 is a diagram illustrating a layout configuration of memory cell MC # with interconnections (second layer to fourth layer) based on a third modification of the first embodiment.

As shown in FIG. 16, the interconnection width of dummy word line DWL is changed, compared with the configuration in FIG. 14.

Specifically, interconnection 346 is changed to an interconnection 346C.

Specifically, interconnection 346C has a thick region and a thin region in interconnection width. The layout can be devised such that the interconnection width is not constant but the interconnection width is maximized, whereby the interline capacitance between dummy word line DWL and word line WL is adjusted.

(Fourth Modification)

Figure 17:
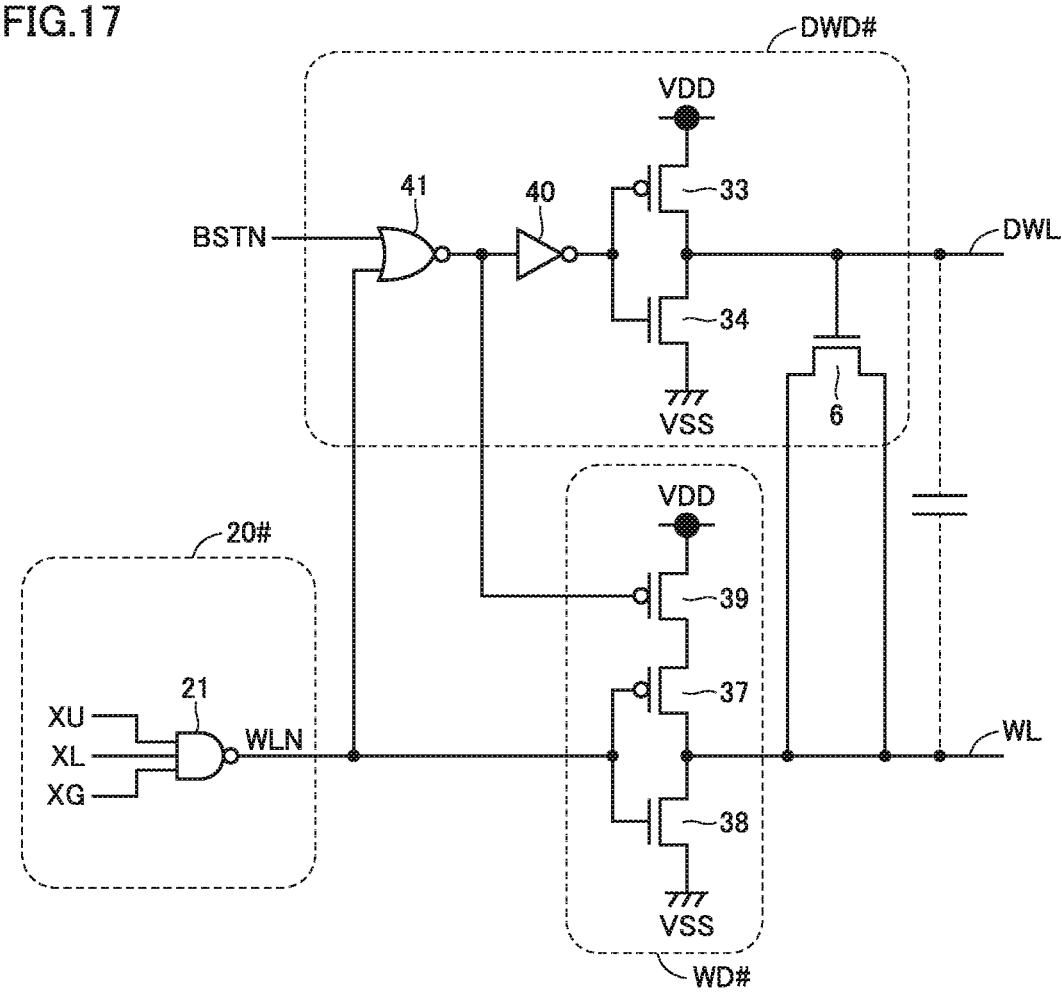
FIG. 17 is a diagram illustrating a circuit configuration of a peripheral circuit based on a fourth modification of the first embodiment.

FIG. 17 is a diagram illustrating a circuit configuration of a peripheral circuit based on a fourth modification of the first embodiment.

As shown in FIG. 17, a word line driver WD #, a dummy word line driver DWD #, and an address decoder 20# are shown here.

Address decoder 20 includes a NAND circuit 21.

NAND circuit 21 receives input of row address signals XU, XL, XG and outputs the result of the NANDN operation as a decode signal WLN.

Address decoder 20 outputs an inversion signal of decode signal WLN to dummy word line driver DWD # and word line driver WD #.

Word line driver WD # includes P-channel MOS transistors 37, 39 and an N-channel MOS transistor 38.

P-channel MOS transistors 39 and 37 and N-channel MOS transistor 38 are connected in series between power supply voltage VDD and ground voltage VSS, and the connection node between P-channel MOS transistor 37 and N-channel MOS transistor 38 is connected to word line WL.

The gates of P-channel MOS transistor 37 and N-channel MOS transistor 38 receive input of decode signal WLN.

The gate of P-channel MOS transistor 39 receives input of an output signal of a NOR circuit 41.

Dummy word line driver DWD # includes NOR circuit 41, an inverter 40, a P-channel MOS transistor 33, an N-channel MOS transistor 34, and a capacitive element 6.

In the initial state, decode signal WLN is set to "H" level.

Accordingly, the gate of N-channel MOS transistor 38 is set to "H" level. N-channel MOS transistor 38 enters an ON state, and word line WL is connected to ground voltage VSS.

Control signal BSTN has been set to "H" level. Accordingly, NOR circuit 41 outputs an inversion signal thereof, that is, a signal at "L" level. Consequently, P-channel MOS transistor 39 enters an ON state. On the other hand, inverter 40 outputs a signal at "H" level. Accordingly, dummy word line DWL is connected to ground voltage VSS.

On the other hand, as a consequence of row address signals XU, XL, XG being set to "H" level, NAND circuit 21 sets decode signal WLN to "L" level. Consequently, P-channel MOS transistor 37 enters an ON state. Consequently, word line WL is connected to power supply voltage VDD. That is, word line WL is activated.

Subsequently, as a consequence of control signal BSTN being set to "L" level, NOR circuit 41 outputs "H" level. Consequently, inverter 40 outputs "L" level. Consequently, P-channel MOS transistor 33 enters an ON state. Consequently, power supply voltage VDD is connected to dummy word line DWL. That is, dummy word line DWL is activated. P-channel MOS transistor 39 enters an OFF state, and word line WL enters a high impedance state (Hi-z).

Capacitive element 6 is provided between dummy word line DWL and word line WL. As described above, dummy word line DWL and word line WL are arranged in parallel with each other and have capacitance between interconnections. Accordingly, the voltage on word line WL is increased (boosted) when dummy word line DWL is activated based on capacitive element 6 and the capacitance between interconnections.

Increasing the voltage on word line WL can improve the write margin and the read margin.

Compared with the configuration in FIG. 4, the NAND circuit, the inverter, and the like can be eliminated. Accordingly, the layout area can be reduced with a reduced number of components.

Second Embodiment

In the foregoing first embodiment, the voltage is increased positively (boosted) for word line WL using dummy word line DWL. In a second embodiment, a case where the voltage is lowered will be described.

Figure 18:
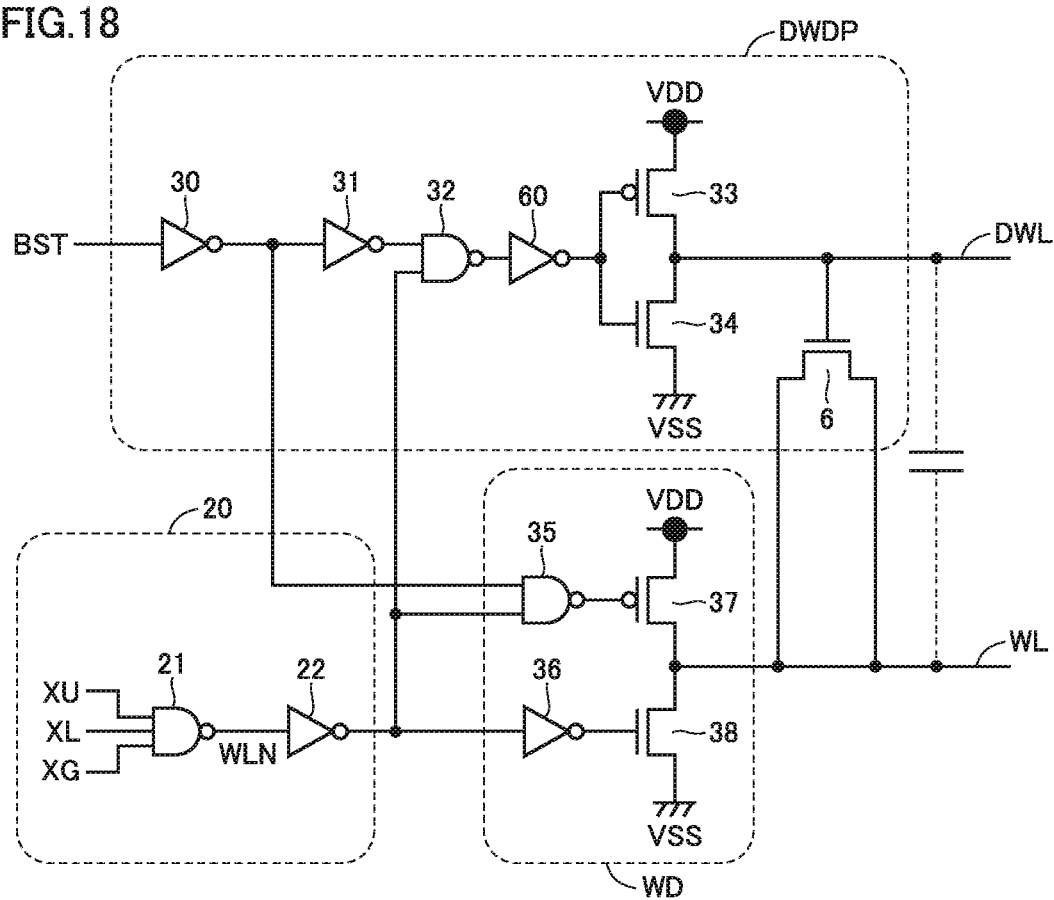
FIG. 18 is a diagram illustrating a circuit configuration of a peripheral circuit based on a second embodiment.

FIG. 18 is a diagram illustrating a circuit configuration of a peripheral circuit based on the second embodiment.

As shown in FIG. 18, the peripheral circuit based on the second embodiment differs from the configuration in FIG. 4 in that dummy word line driver DWD is replaced by a dummy word line driver DWDP.

Dummy word line driver DWDP differs from dummy word line driver DWD in that an inverter 60 is further added. The other configuration is the same and a detailed description thereof will not be repeated.

Specifically, inverter 60 receives output of NAND circuit 32 and outputs an inversion signal thereof to the gates of P-channel MOS transistor 33 and N-channel MOS transistor 34.

In the initial state, decode signal WLN is set to "H" level.

Accordingly, the gate of N-channel MOS transistor 38 is set to "H" level. N-channel MOS transistor 38 enters an ON state, and word line WL is connected to ground voltage VSS.

Control signal BST has been set to "L" level. Accordingly, an inversion signal thereof, that is, a signal at "H" level is output to NAND circuit 35. NAND circuit 32 outputs a signal at "H" level. Inverter 60 outputs a signal at "L" level. Consequently, P-channel MOS transistor 33 enters an ON state, and dummy word line DWL is connected to power supply voltage VDD.

On the other hand, as a consequence of row address signals XU, XL, XG being set to "H" level, NAND circuit 21 sets decode signal WLN to "L" level. Consequently, the gate of N-channel MOS transistor 38 is set to "L" level. Accordingly, N-channel MOS transistor 38 enters an OFF state. NAND circuit 35 outputs a signal at "L" level to P-channel MOS transistor 37, based on an inversion signal of decode signal WLN through inverter 22 and an inversion signal of control signal BST through inverter 30. Consequently, P-channel MOS transistor 37 enters an ON state, and word line WL is connected to power supply voltage VDD. That is, word line WL is activated.

Subsequently, as a consequence of control signal BST being set to "H" level, NAND circuit 35 outputs "H" level. Consequently, P-channel MOS transistor 37 enters an OFF state, and word line WL enters a high impedance state (Hi-z).

NAND circuit 32 outputs "L" level. Inverter 60 outputs a signal at "H" level. Consequently, N-channel MOS transistor 34 enters an ON state. Consequently, ground voltage VSS is connected to dummy word line DWL.

Capacitive element 6 is provided between dummy word line DWL and word line WL. As described above, dummy word line DWL and word line WL are arranged in parallel with each other and have capacitance between interconnections. Accordingly, the voltage on word line WL becomes lower than power supply voltage VDD when dummy word line DWL is activated based on capacitive element 6 and the capacitance between interconnections.

Figure 19:
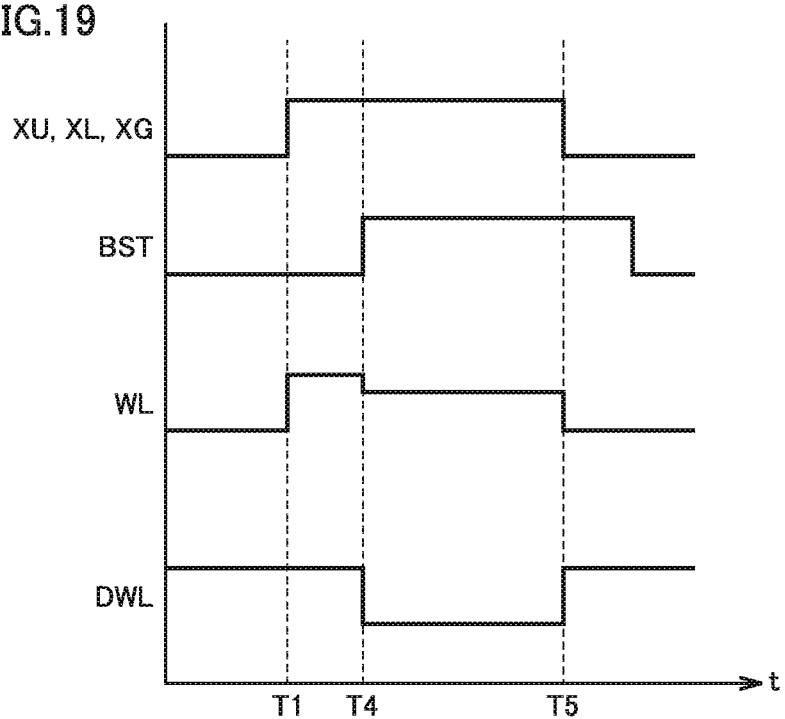
FIG. 19 is a timing chart in which word line WL is activated based on the second embodiment.

FIG. 19 is a timing chart in which word line WL is activated based on the second embodiment.

As shown in FIG. 19, at time T1, as a consequence of row address signals XU, XL, XG being set to "H" level, word line WL is activated.

Dummy word line DWL has been set to "H" level.

Subsequently, at time T4, as a consequence of control signal BST being set to "H" level, the voltage on word line WL is lowered.

At time T5, as a consequence of row address signals XU, XL, XG being set to "L" level, word line WL is inactivated.

In this system, lowering the voltage on word line WL can improve the data hold margin of a memory cell.

Third Embodiment

Figure 20:
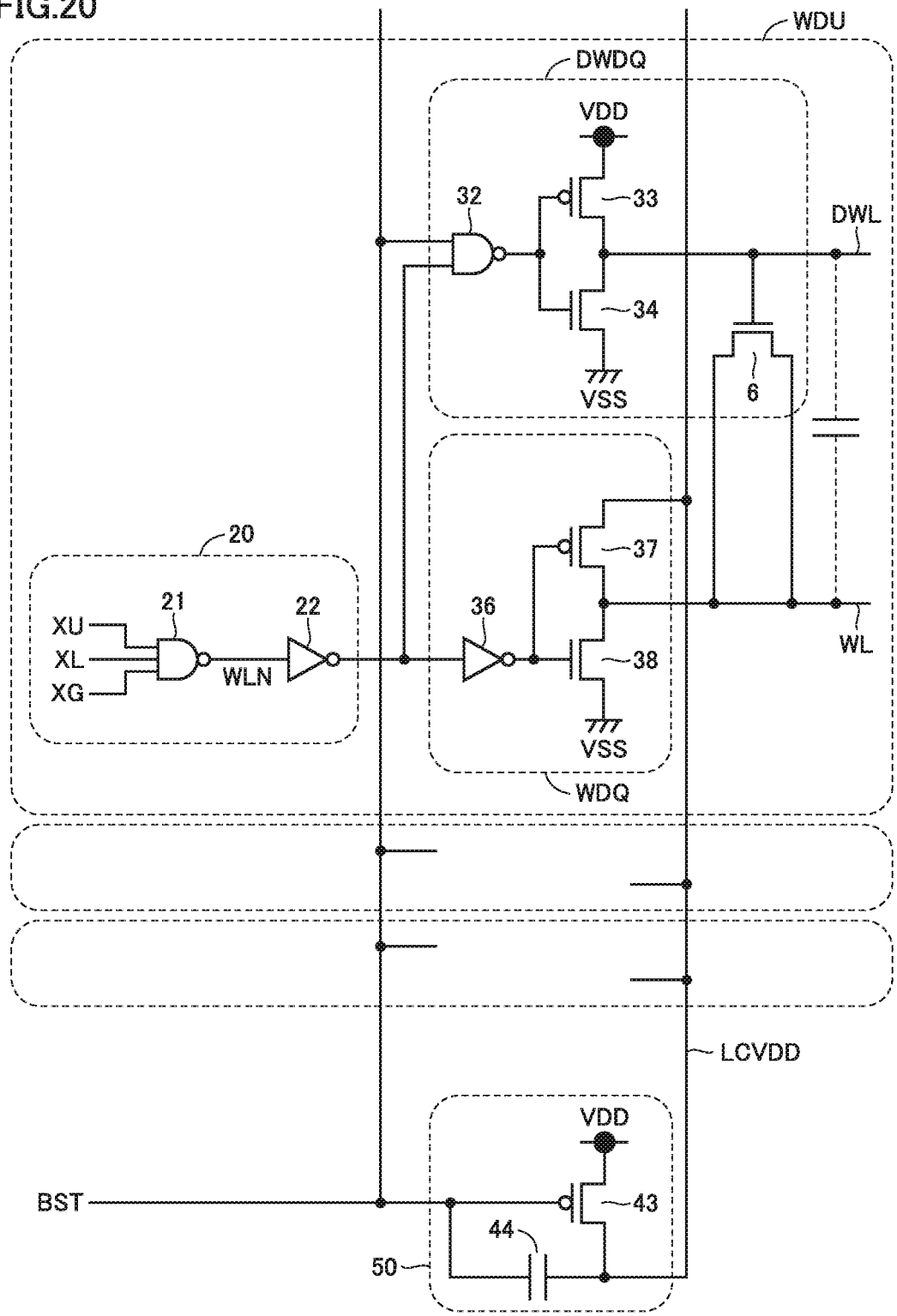
FIG. 20 is a diagram illustrating a circuit configuration of a peripheral circuit based on a third embodiment.

FIG. 20 is a diagram illustrating a circuit configuration of a peripheral circuit based on a third embodiment.

As shown in FIG. 20, here, a word driver unit WDU is provided for each memory cell row. Word driver unit WDU is configured with a word line driver WDQ for driving word line WL, a dummy word line driver DWDQ for driving dummy word line DWL, and an address decoder 20.

Address decoder 20 includes a NAND circuit 21 and an inverter 22.

NAND circuit 21 receives input of row address signals XU, XL, XG and outputs the result of the NANDN operation as a decode signal WLN. Inverter 22 outputs an inversion signal of decode signal WLN to word line driver WDQ and dummy word line driver DWDQ.

Word line driver WDQ includes an inverter 36, a P-channel MOS transistor 37, and an N-channel MOS transistor 38.

P-channel MOS transistor 37 and N-channel MOS transistor 38 are provided in series between power supply voltage VDD and ground voltage VSS, and the connection node between P-channel MOS transistor 37 and N-channel MOS transistor 38 is connected to word line WL. The gates of P-channel MOS transistor 37 and N-channel MOS transistor 38 receive input of decode signal WLN through inverters 22 and 36.

The source of P-channel MOS transistor 37 is connected to a power supply line LCVDD.

Dummy word line driver DWDQ includes an NAND circuit 32, a P-channel MOS transistor 33, an N-channel MOS transistor 34, and a capacitive element 6.

NAND circuit 32 receives input of control signal BST and input of an inversion signal of decode signal WLN through inverter 22 and outputs the result of the NAND operation.

P-channel MOS transistor 33 and N-channel MOS transistor 34 are provided between power supply voltage VDD and ground voltage VSS, and the connection node thereof is connected to dummy word line DWL. The gates of P-channel MOS transistor 33 and N-channel MOS transistor 34 receive input of an output signal of NAND circuit 32.

Capacitive element 6 is formed with an N-channel MOS transistor. The source and the drain of the N-channel MOS transistor are connected to word line WL. The gate is connected to dummy word line DWL. Alternatively, capacitive element 6 may be formed with a P-channel MOS transistor.

Power supply line LCVDD is connected to a power supply circuit 50.

Power supply circuit 50 includes a P-channel MOS transistor 43 and a capacitor 44.

P-channel MOS transistor 43 is provided between power supply voltage VDD and power supply line LCVDD and has its gate receiving input of control signal BST. Capacitor 44 is connected between the gate and the drain of P-channel MOS transistor 43. Capacitor 44 is provided as a stabilizing capacitance for stabilizing the potential of power supply line LCVDD.

Power supply line LCVDD is provided in common for word driver units WDU provided for respective memory cell rows.

In the initial state, decode signal WLN is set to "H" level.

Accordingly, the gate of N-channel MOS transistor 38 is set to "H" level. N-channel MOS transistor 38 enters an ON state, and word line WL is connected to ground voltage VSS.

Control signal BST has been set to "L" level. P-channel MOS transistor 43 is in an ON state, and power supply line LCVDD is connected to power supply voltage VDD.

On the other hand, as a consequence of row address signals XU, XL, XG being set to "H" level, NAND circuit 21 sets decode signal WLN to "L" level. Consequently, P-channel MOS transistor 37 enters an ON state. Accordingly, word line WL is connected to power supply voltage VDD. That is, word line WL is activated.

Subsequently, as a consequence of control signal BST being set to "H" level, P-channel MOS transistor 43 turns off. Thus, power supply line LCVDD is isolated from power supply voltage VDD, and word line WL enters a high impedance state (Hi-z).

NAND circuit 32 outputs "L" level. Consequently, P-channel MOS transistor 33 enters an ON state. Consequently, dummy word line DWL is connected to power supply voltage VDD. That is, dummy word line DWL is activated.

Capacitive element 6 is provided between dummy word line DWL and word line WL. As described above, dummy word line DWL and word line WL are arranged in parallel with each other and have capacitance between interconnections. Accordingly, the voltage on word line WL is increased (boosted) when dummy word line DWL is activated based on capacitive element 6 and the capacitance between interconnections.

Increasing the voltage on word line WL can improve the write margin and the read margin.

Compared with the configuration in FIG. 4, the NAND circuit, the inverter, and the like can be eliminated. Accordingly, the layout area can be reduced with a reduced number of components.

Figure 21:
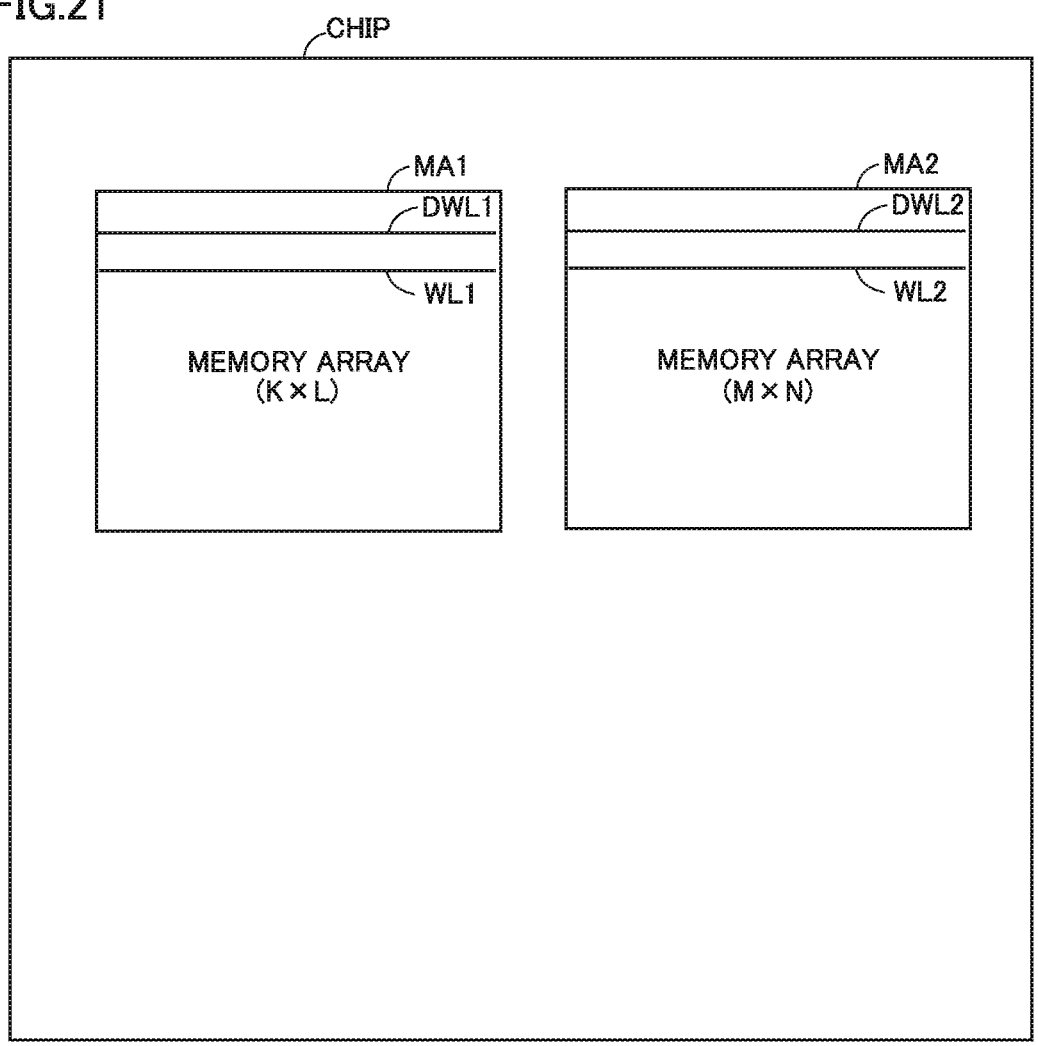
FIG. 21 is an external configuration diagram of a semiconductor device CHIP based on a fourth embodiment.

FIG. 21 is an external configuration diagram of a semiconductor device CHIP based on a fourth embodiment.

Referring to FIG. 21, semiconductor device CHIP includes memory arrays MA1 MA2. The peripheral circuits of the memory arrays are not shown.

Memory array MA1 includes memory cells arranged in a matrix with K rows and L columns, and a plurality of word lines WL1 and dummy word lines DWL1 corresponding to memory cell rows.

Memory array MA2 includes memory cells arranged in a matrix with M rows and N columns, and a plurality of word lines WL2 and dummy word lines DWL2 corresponding to memory cell rows.

An embedded memory mounted on an SoC or a microcomputer is generally generated by a memory compiler in accordance with the required memory size.

In memory array MA1, a word line WL1 having a length corresponding to L columns of memory cells is generated, and in memory array MA2, a word line WL2 having a length corresponding to N columns of memory cells is generated.

A dummy word line is defined as an interconnection arranged in parallel with a word line whereby a dummy word line can be generated by a memory complier.

Dummy word line DWL1 is generated with a length corresponding to L columns of memory cells. If N is smaller than L, dummy word line DWL2 is generated with a length shorter than DWL1, in accordance with N columns of memory cells.

Thus, capacitance between interconnections can be generated in accordance with the length of the word line, using a memory complier.

Although the invention made by the inventors of the present invention has been specifically described above, it is needless to say that the present invention is not limited to the embodiments above and is susceptible to various modifications without departing from the spirit of the invention.

REFERENCE SIGNS LIST

2 I/O circuit group, 6 capacitive element, 17 driver&decoder, 19 control unit, 20 address decoder, 50 power supply circuit, MA memory array.

The invention claimed is:
1. A semiconductor storage device comprising:
a memory cell formed on a semiconductor substrate;
a word line connected to the memory cell and formed in a first metal interconnection layer located over the semiconductor substrate;
a dummy word line formed in a second metal interconnection layer located over the semiconductor substrate and adjacent to the first metal interconnection layer;
a word driver circuit including a first PMOS (P-type Metal-Oxide-Semiconductor) transistor and a first

NMOS (N-type Metal-Oxide-Semiconductor) transistor connected in series between a first power supply voltage and a first ground voltage lower than the first power supply voltage, and supplying the first power supply voltage to the word line corresponding to an address signal;
a dummy word driver circuit including a second PMOS transistor and a second NMOS transistor connected in series between a second power supply voltage and a second ground voltage lower than the second power supply voltage, and supplying the second power supply voltage to the dummy word line;
a first inverter which receives a control signal and outputs an inversion signal of the control signal as a first signal;
a second inverter which receives the first signal and outputs an inversion signal of the first signal as a second signal;
an address decoder which receives the address signal and outputs a decode signal;
a third inverter which receives the decode signal and outputs an inversion signal of the decode signal as a third signal; a first NAND circuit which receives the first signal and the decode signal; and
a second NAND circuit which receives the second signal and the decode signal,
wherein a gate of the first PMOS transistor is connected to an output of the first NAND circuit, and
wherein a gate of the first NMOS transistor is connected to an output of the third inverter,
wherein a gate of the second PMOS transistor and a gate of the second NMOS transistor are connected to an output of the second NAND circuit.

2. The semiconductor storage device according to claim 1, wherein the dummy word driver circuit further includes a capacitive element provided between the word line and the dummy word line,
wherein the capacitive element has a gate connected to the dummy word line and a source and a drain both connected to the word line.

3. The semiconductor storage device according to claim 1, wherein the dummy word line is arranged in parallel with the word line.

4. The semiconductor storage device according to claim 1, wherein the dummy word line and the word line have different lengths.

5. The semiconductor storage device according to claim 1, wherein at least a partial width of the dummy word line is formed to be thicker than a width of the word line.

6. The semiconductor storage device according to claim 1, wherein the dummy word line is set to a fixed voltage when the word line is not driven.

7. The semiconductor storage device according to claim 1, wherein the memory cell is a Static Random Access Memory (SRAM) cell.

8. The semiconductor storage device according to claim 7, wherein the Static Random Access Memory cell is formed with a fin transistor.

9. The semiconductor storage device according to claim 1, wherein the word driver circuit sets the word line to a high impedance state when voltage on the word line is increased.

10. The semiconductor storage device according to claim 1,
wherein the first power supply voltage and the second power supply voltage have the same voltage value, and
wherein the first ground voltage and the second ground voltage have the same voltage value.

11. The semiconductor storage device according to claim 1,
wherein the supply of the first power supply voltage to the word line is cut off by the control signal and the supply of the second power supply voltage to the dummy word line is started corresponding to the control signal.

12. A semiconductor storage device comprising:
a memory cell formed on a semiconductor substrate;
a word line connected to the memory cell and formed in a first metal interconnection layer located over the semiconductor substrate;
a dummy word line formed in a second metal interconnection layer located over the semiconductor substrate and adjacent to the first metal interconnection layer;
a word driver circuit including a first MOS (Metal-Oxide Semiconductor) transistor of a first conductivity type and a second MOS transistor of a second conductivity type connected in series between a first power supply voltage and a first ground voltage lower than the first power supply voltage, and supplying the first power supply voltage to the word line corresponding to an address signal;
a dummy word driver circuit including a third MOS transistor of a first conductivity type and a fourth MOS transistor of a second conductivity type connected in series between a second power supply voltage and a second ground voltage lower than the second power supply voltage, and supplying the second power supply voltage to the dummy word line;
a first inverter which receives a control signal and outputs an inversion signal of the control signal as a first signal;
a second inverter which receives the first signal and outputs an inversion signal of the first signal as a second signal;
an address decoder which receives the address signal and outputs a decode signal;
a third inverter which receives the decode signal and outputs an inversion signal of the decode signal as a third signal;
a first NAND gate circuit which receives the first signal and the decode signal; and
a second NAND gate circuit which receives the second signal and the decode signal,
wherein a gate of the first MOS transistor of the first conductivity type is connected to an output of the first NAND gate circuit, and
wherein a gate of the second MOS transistor of the second conductivity type is connected to an output of the third inverter,
wherein a gate of the third MOS transistor of the first conductivity type and the gate of the fourth MOS transistor of the second conductivity type are connected to an output of the second NAND gate circuit.

13. The semiconductor storage device according to claim 12,
wherein the dummy word driver circuit further includes a capacitive element provided between the word line and the dummy word line, and
wherein the capacitive element includes a gate connected to the dummy word line and a source and a drain both connected to the word line.

14. The semiconductor storage device according to claim 12,
wherein the first power supply voltage and the second power supply voltage have a same voltage value, and
wherein the first ground voltage and the second ground voltage have a same voltage value.

15. The semiconductor storage device according to claim 12,
  wherein the supply of the first power supply voltage to the word line is cut off by the control signal and the supply of the second power supply voltage to the dummy word line is started corresponding to the control signal.

* * * * *